US010489700B1

(12) United States Patent
Asnaashari et al.

(10) Patent No.: US 10,489,700 B1
(45) Date of Patent: Nov. 26, 2019

(54) NEUROMORPHIC LOGIC FOR AN ARRAY OF HIGH ON/OFF RATIO NON-VOLATILE MEMORY CELLS

(71) Applicant: Crossbar, Inc., Santa Clara, CA (US)

(72) Inventors: Mehdi Asnaashari, Danville, CA (US); Tanmay Kumar, Pleasanton, CA (US); Hagop Nazarian, San Jose, CA (US); Sung Hyun Jo, Sunnyvale, CA (US)

(73) Assignee: Crossbar, Inc., Santa Clara, CA (US)

( * ) Notice: Subject to any disclaimer, the term of this patent is extended or adjusted under 35 U.S.C. 154(b) by 760 days.

(21) Appl. No.: 14/793,156

(22) Filed: Jul. 7, 2015

Related U.S. Application Data

(60) Provisional application No. 62/021,658, filed on Jul. 7, 2014, provisional application No. 62/167,495, filed on May 28, 2015.

(51) Int. Cl.
*G06N 3/04* (2006.01)
*G11C 13/00* (2006.01)

(52) U.S. Cl.
CPC .......... *G06N 3/04* (2013.01); *G11C 13/0069* (2013.01)

(58) Field of Classification Search
None
See application file for complete search history.

(56) References Cited

U.S. PATENT DOCUMENTS

| 2007/0195590 A1* | 8/2007 | Sugita | G11C 13/0007 365/163 |
|---|---|---|---|
| 2010/0110765 A1* | 5/2010 | Tian | G11C 13/0007 365/148 |
| 2010/0277232 A1* | 11/2010 | Snider | G06N 3/063 327/565 |
| 2012/0109864 A1* | 5/2012 | Modha | G06N 3/063 706/25 |
| 2014/0172762 A1* | 6/2014 | Suri | G06N 3/08 706/25 |

OTHER PUBLICATIONS

Rose et al., "Amorphous Silicon Analogue Memory Devices for Artificial Neural Networks," Solid State Phenomena, 1995, Trans Tech Publications, 19 pages. (Year: 1995).*
Rose et al., "Amorphous Silicon Analogue Memory Devices for Artificial Neural Networks" (Year: 1995).*
Rose et al., "Amorphous Silicon Analogue Memory Devices for Artificial Neural Networks," Solid State Phenomena, 1995, Trans Tech Publications, 19 pages.

* cited by examiner

*Primary Examiner* — James G Norman
(74) *Attorney, Agent, or Firm* — Wegman Hessler

(57) ABSTRACT

Various embodiments disclosed herein provide for a neuromorphic logic system, comprising a bitline and a set of wordlines. The neuromorphic logic system also includes a set of resistive switching memory cells, respectively comprising a two-terminal volatile switching device and a two-terminal non-volatile memory device, at each intersection between the bit line and the set of wordlines, wherein the set of resistive switching memory cells are programmed to a set of resistive states and receive a voltage on the bitline above an activation threshold and wherein the magnitude of the voltage applied to the bitline corresponds to a magnitude of a sensory input, resulting in a current that corresponds to the magnitude of the sensor input and the set of resistive states.

20 Claims, 14 Drawing Sheets

NEUROMORPHIC LOGIC FOR AN ARRAY OF HIGH ON/OFF RATIO NON-VOLATILE MEMORY CELLS

PRIORITY

The present application claims the benefit of priority to provisional application Ser. No. 62/021,658, titled "Field Assisted Superliner Threshold (FAST™)" filed on Jul. 7, 2014 and to provisional application Ser. No. 62/167,495, titled "Logic Applications For An Array Of High On/Off Ratio Non-Volatile Memory Cells Including Neuromorphic Logic" filed on May 28, 2015, the entireties of which are both incorporated by reference herein and for all purposes.

TECHNICAL FIELD

The subject disclosure relates generally to resistive switching memory, and as one illustrative example, neuromorphic logic using a memory array of resistive switching memory cells.

BACKGROUND

The inventor(s) of the present disclosure have proposed models of two-terminal memory devices that he expects to operate as viable alternatives to various memory cell technologies, such as metal-oxide semiconductor (MOS) type memory cells employed for electronic storage of digital information. Models of memory cells using two-terminal memory such as resistive-switching memory devices among others, are believed by the inventor(s) to provide some potential advantages over purely non-volatile FLASH MOS type transistors, including smaller die size, higher memory density, faster switching (e.g., from a relatively conductive state to a relatively non-conductive state, or vice versa), good data reliability, low manufacturing cost, fab-compatible processes, and other advantages, for example.

SUMMARY

The following presents a simplified summary of the specification in order to provide a basic understanding of some aspects of the specification. This summary is not an extensive overview of the specification. It is intended to neither identify key or critical elements of the specification nor delineate the scope of any particular embodiments of the specification, or any scope of the claims. Its purpose is to present some concepts of the specification in a simplified form as a prelude to the more detailed description that is presented in this disclosure.

Various embodiments disclosed herein provide for a neuromorphic logic system, comprising a bitline and a set of wordlines. The neuromorphic logic system also includes a set of resistive switching memory cells, respectively comprising a two-terminal volatile switching device and a two-terminal non-volatile memory device, at each intersection between the bit line and the set of wordlines, wherein the set of resistive switching memory cells are programmed to a set of resistive states and receive a voltage on the bitline above an activation threshold and wherein the magnitude of the voltage applied to the bitline corresponds to a magnitude of a sensory input, resulting in a current that corresponds to the magnitude of the sensor input and the set of resistive states.

In another embodiment, a neuromorphic logic system, comprising a wordline and a set of bitlines is provided. The neuromorphic logic system also includes a set of resistive switching memory cells, respectively comprising a two-terminal volatile switching device and a two-terminal non-volatile memory device, at each intersection between the wordline and the set of bitlines, wherein the set of resistive switching memory cells are programmed to a set of resistive states and receive a voltage on the wordline above an activation threshold and wherein the magnitude of the voltage applied to the wordline corresponds to a magnitude of a sensory input, resulting in a current that corresponds to the magnitude of the sensor input and the set of resistive states.

In yet another embodiment, a neuromorphic logic method comprises receiving a voltage on a bitline, wherein the voltage corresponds to a sensory input. The method also includes forming a current that corresponds to an amplitude of the sensory input based on a set of resistive switching memory cells, respectively comprising a two-terminal volatile switching device and a two-terminal non-volatile memory device, at a set of resistive states at intersections between the bitline and a set of wordlines, and resistive states of the set of resistive switching memory cells.

The following description and the drawings set forth certain illustrative aspects of the specification. These aspects are indicative, however, of but a few of the various ways in which the principles of the specification may be employed. Other advantages and novel features of the specification will become apparent from the following detailed description of the specification when considered in conjunction with the drawings.

BRIEF DESCRIPTION OF THE DRAWINGS

Various aspects or features of this disclosure are described with reference to the drawings, wherein like reference numerals are used to refer to like elements throughout. In this specification, numerous specific details are set forth in order to provide a thorough understanding of this disclosure. It should be understood, however, that certain aspects of the subject disclosure may be practiced without these specific details, or with other methods, components, materials, etc. In other instances, well-known structures and devices are shown in block diagram form to facilitate describing the subject disclosure.

DETAILED DESCRIPTION

Figure 1:
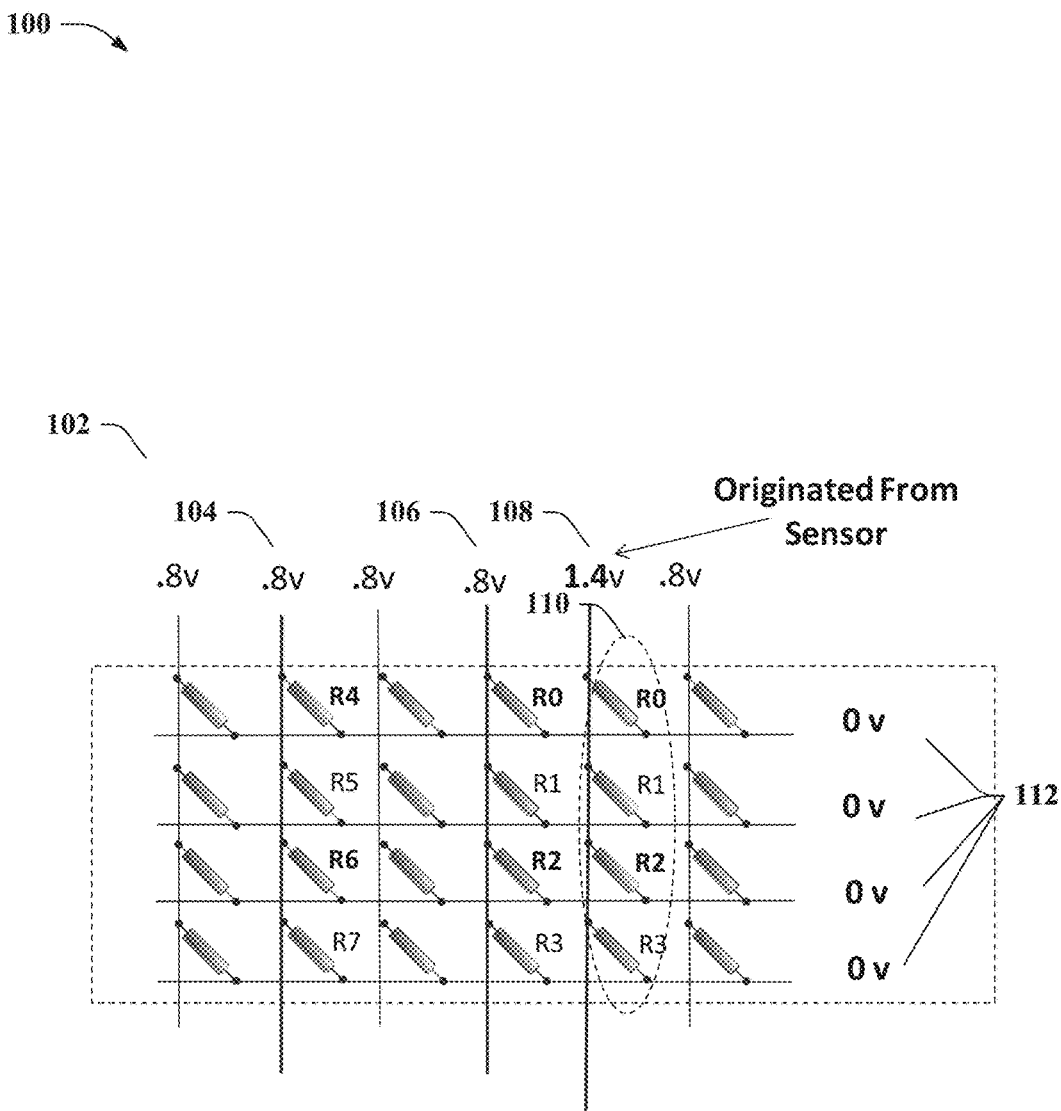
FIG. 1 illustrates a schematic diagram of a neuromorphic application of a memory array in accordance with various aspects described herein.

This disclosure relates to a non-volatile memory device comprising one or more volatile elements. In some embodiments, the non-volatile memory device can include a resistive two-terminal selector device that can be in a low resistive state or a high resistive state in response to respective voltages, or respective ranges of voltages, applied to the resistive two-terminal selector device. The selector device can be a volatile switching device with multiple thresholds (or narrow threshold ranges) (e.g., a positive threshold and a negative threshold). In various embodiments, the selector device is a resistive switching device, or a field induced superlinear threshold (FAST™) switching device (or selector device) under development by the assignee of the present invention. In addition to the resistive two-terminal selector device, the non-volatile memory device can include a capacitor structure and a MOS ("metal-oxide-semiconductor") transistor (which can act or operate as an additional capacitor, in at least some disclosed embodiments). A first terminal of the capacitor can be coupled to a voltage source, and the second terminal of the capacitor can be coupled to a first selector terminal of the selector device. In one or more embodiments, the MOS transistor can be an NMOS transistor comprising a floating gate connected to a second selector terminal of the selector device. Electrical conductivity between a source and drain of the NMOS transistor is modulated by a charge magnitude stored on the MOS transistor gate which is floating (e.g., typically not connected to a power source) during read operation. In one or more additional embodiments a second NMOS transistor can be provided having a source or drain connected in series with the source/drain of the first NMOS transistor.

In various embodiments, a disclosed volatile selector device can be a filamentary-based device. One example of a filamentary-based device can comprise: a first conductive layer, e.g., metal bearing layer (e.g. TiN, TaN, Cu, Al, Ag, or alloy thereof, etc.), doped p-type (or n-type) silicon (Si) bearing layer (e.g., p-type or n-type polysilicon, p-type or n-type polycrystalline SiGe, etc.); a resistive switching layer (RSL); and a second conductive layer (e.g. a material selected from the list described for the first conductive layer). Under suitable bias conditions, conductive ions form within the first conductive layer, and the first conductive layer provides conductive ions to the RSL. In various embodiments, a bias may be an applied voltage exceeding a magnitude of a threshold voltage (e.g. an applied voltage exceeding a positive threshold voltage). In various embodiments, the conductive ions become neutral metal particles in absence of the bias and form a conductive filament within the RSL that can facilitate electrical conductivity through at least a subset of the RSL. In some embodiments, the resistance of the filament-based device can then be determined by a tunneling resistance between the filament and the second conductive layer (or by an inherent resistivity of a conductive short through the RSL (e.g., formed by the metal particles forming the filament within the RSL)).

According to further embodiments, the second conductive layer can also comprise neutral metal particles capable of being ionized. In such embodiments, the second conductive layer can form metal ions and provide the metal ions to the RSL in response to a second suitable bias condition(s). In various embodiments, a bias may be an applied voltage exceeding a magnitude of a threshold voltage (e.g. an applied voltage less than a negative threshold voltage). Under suitable conditions, conductive ions are formed within the second conductive layer and depending upon bias conditions, the second conductive layer provides conductive ions to the RSL. In such embodiments, the conductive ions form neutral metal particles, in absence of the bias, and form a conductive filament within the RSL that can facilitate electrical conductivity through at least a subset of the RSL. The resistance of the filament-based device can then be determined by a tunneling resistance between the filament and the first conductive layer (or by an inherent resistivity of a conductive short through the RSL (e.g., formed by the ions forming the filament within the RSL)).

In various embodiments, if an applied voltage is about zero, e.g. ground, conductive filaments are not appreciably formed within the RSL. Accordingly, the resistance of the RSL layer is substantially higher than when the above embodiments are under the bias conditions described above.

In various embodiments of a memory cell of the present disclosure, a p-type or n-type Si bearing layer can include a p-type or n-type polysilicon, p-type or n-type polycrystalline SiGe, or the like. A RSL (which can also be referred to in the art as a resistive switching media (RSM)) can comprise, e.g., an undoped amorphous Si layer, a semiconductor layer having intrinsic characteristics, a Si sub-oxide (e.g., SiOx wherein x has a non-zero value less than 2), and so forth. Other examples of materials suitable for the RSL could include $Si_XGe_YO_Z$ (where X, Y and Z are respective suitable positive numbers), a silicon oxide (e.g., $SiO_N$, where N is a suitable positive number), amorphous Si (a-Si), amorphous SiGe (a-SiGe), $TaO_B$ (where B is a suitable positive number), $HfO_C$ (where C is a suitable positive number), $TiO_D$ (where D is a suitable number), $Al_2O_E$ (where E is a suitable positive number), a non-stiochiometric silicon-bearing material, a non-stiochiometric metal oxide, and so forth, or a suitable combination thereof. In various embodiments, the RSL includes few or a low number of material voids or defects which can trap conductive particles; accordingly, in some embodiments, the conductive particles have relatively good diffusive or drift mobility within the RSL.

A conductive material for the first conductive material and/or the second conductive material may include, among others: silver (Ag), gold (Au), titanium (Ti), titanium-nitride (TiN) or other suitable compounds of titanium, nickel (Ni), copper (Cu), aluminum (Al), chromium (Cr), tantalum (Ta), iron (Fe), manganese (Mn), tungsten (W), vanadium (V), cobalt (Co), platinum (Pt), hafnium (Hf), and palladium (Pd). Other suitable conductive materials, as well as compounds, alloys, or combinations of the foregoing or similar materials can be employed for the active metal layer in some aspects of the subject disclosure. Some details pertaining to embodiments of the subject disclosure similar to the foregoing example(s) can be found in the following U.S. patent applications that are licensed to the assignee of the present application for patent: application Ser. No. 11/875,541 filed Oct. 19, 2007 and application Ser. No. 12/575,921 filed Oct. 8, 2009, each of which are incorporated by reference herein in their respective entireties and for all purposes.

In various disclosed embodiments, filamentary-based switching devices are disclosed and their operation is described. In some embodiments, a filamentary-based switching device can be a volatile switching device, which exhibits a first measurably distinct state in the absence of a suitable external stimulus (or stimuli), and exhibits a second measurably distinct state in response to the suitable external stimulus (or stimuli). The volatile filamentary-based switching device is often referred to herein as a selector device, or selection device, filamentary selector device, filamentary-based selector device, and so on; though such devices, their composition or application should not be limited by this terminology. In various embodiments, a filamentary selector device is provided in a circuit to facilitate formation of a non-volatile memory cell, having very fast performance. In some embodiments, the non-volatile memory cell can have a read performance less than 20 nanoseconds (ns), less than 10 nanoseconds, or between 1 ns and 5 ns, in various embodiments. In various embodiments, a selector device developed by the assignee of the present invention, under the trademarks Field Assisted Superliner Threshold™ or FAST™, is utilized.

A filamentary selector device according to various disclosed embodiments can exhibit a first state (e.g., a first electrical resistance, or other suitable measurable characteristic) in the absence of a suitable external stimulus (or stimuli). The stimulus (or stimuli) can have a threshold value or range of such values that induces the filamentary selector device to change from the first state to a second state while the stimulus is applied. In response to the stimulus falling below the threshold value (or outside of the threshold range of values) the filamentary selector device returns to the first state. In some disclosed embodiments, a filamentary based selector device can operate in a bipolar fashion, behaving differently in response to different polarity (or direction, energy flow, energy source orientation, etc.) external stimuli, (e.g. response graph appearing like the letter "U"). As an illustrative example, in response to a first polarity stimulus exceeding a first threshold voltage (or set of voltages), the filamentary selector device can change to the second state from the first state. Moreover, in response to a second polarity stimulus exceeding a second threshold voltage(s), the filamentary selector device can change to a third state from the first state. In some embodiments, the third state can be substantially the same as the first state, having the same or similar measurably distinct characteristic (e.g., electrical conductivity, and so forth), or switching in response to the same or similar magnitude of threshold stimulus, or range thereof, (though of opposite polarity or direction), or the like. In other embodiments, the third state can be distinct from the second state, either in terms of the measurable characteristic (e.g., different reverse electrical conductivity value in response to the reverse polarity as compared to a forward electrical conductivity value in response to the forward polarity) or in terms of threshold stimulus associated with transitioning out of the first state (e.g., a different magnitude of positive voltage required to transition to the second state, compared to a magnitude of negative voltage required to transition to the third state).

In other embodiments, the selector device may be a unipolar device, having a single threshold voltage. When an applied voltage, at least between ground and the threshold voltage is applied, the selector device has a high characteristic resistance. Further, when the applied voltage has a magnitude greater than the threshold voltage (e.g. more positive than a positive threshold voltage, or more negative than a negative threshold voltage), the selector device has a low characteristic resistance. In one embodiment, the selector device may have a response graph appearing like a reverse letter "L"). In some embodiments, two unipolar devices may be placed in parallel, with opposite polarity. It is expected that such a configuration of unipolar devices would provide a characteristic response similar to the bipolar selector device, described above (e.g. a response graph appearing like the letter "U").

As stated above, a disclosed filamentary based selector device can form a conductive path or filament through a relatively high resistive portion in response to a suitable external stimulus (or range of stimulus). The external stimulus (or stimuli) can cause metallic particles within a terminal of the selector device (e.g., active metal layer terminal, conductive layer terminal, etc.) to migrate within (or ionize within) a RSL layer of the filamentary selector device. Further, the RSL can be selected to have relatively few physical defect locations for the volatile filamentary switching device, facilitating relatively good mobility of the metallic particles within the RSL. Accordingly, with respect to a forward direction and positive polarity stimulus, below an associated positive threshold stimulus (or narrow range of positive threshold values), the metallic particles can disperse within the RSL, resisting or avoiding formation of a sufficient conductive path through the RSL to lower a high resistance associated with the first state. Above the threshold, the external stimulus maintains the metallic particles in sufficient formation to provide the conductive path, leading to relatively low resistance of the second state. An analogous mechanism can control operation of the third state (in a reverse direction and reverse polarity stimulus) in the bipolar context.

It should be appreciated that various embodiments herein may utilize a variety of memory cell technologies, having different physical properties. For instance, different resistive-switching memory cell technologies can have different discrete programmable resistances, different associated program/erase voltages, as well as other differentiating characteristics. For instance, various embodiments of the subject disclosure can employ a bipolar switching device that exhibits a first switching response (e.g., programming to one of a set of program states) to an electrical signal of a first polarity and a second switching response (e.g., erasing to an erase state) to the electrical signal having a second polarity. The bipolar switching device is contrasted, for instance, with a unipolar device that exhibits both the first switching response (e.g., programming) and the second switching response (e.g., erasing) in response to electrical signals having the same polarity and different magnitudes.

Where no specific memory cell technology or program/erase voltage is specified for the various aspects and embodiments herein, it is intended that such aspects and embodiments incorporate any suitable memory cell technology and be operated by program/erase voltages appropriate to that technology, as would be known by one of ordinary skill in the art or made known by way of the context provided herein. It should be appreciated further that where substituting a different memory cell technology would require circuit modifications that would be known to one of ordinary skill in the art, or changes to operating signal levels that would be known to one of such skill, embodiments comprising the substituted memory cell technology(ies) or signal level changes are considered within the scope of the subject disclosure.

The inventor(s) of the present application is of the opinion that two-terminal memory devices, such as resistive switching memory devices, have various advantages in the field of electronic memory. For instance, resistive-switching memory technology can generally be small, typically consuming silicon area on the order of $4F^2$ per adjacent resistive-switching device where F stands for the minimum feature size of a technology node (e.g., a memory cell comprising two resistive-switching devices would therefore be approximately $8F^2$ if constructed in adjacent silicon space if on the order of $4F^2$). Non-adjacent resistive-switching devices, e.g., stacked above or below each other, can consume as little as $4F^2$ for a set of multiple non-adjacent devices. Moreover, multi-bit devices having two, three or more bits (e.g., resistance states) per memory cell can result in even greater densities in terms of bits per silicon area consumed. These advantages can lead to greater semiconductor component density and memory density, and low manufacturing costs for a given number of digital storage bits. The inventor(s) also believes that resistive-switching memory can exhibit fast programming speed and low programming current, and smaller cell sizes enabling greater component densities. Other benefits anticipated by the inventor(s) include non-volatility, having the capacity to store data without continuous application of power, and capacity to be built between metal interconnect layers, enabling resistive switching based devices to be usable for two-dimension as well as three-dimension semiconductor architectures.

The inventors of the subject application are familiar with additional non-volatile, two-terminal memory structures. For example, ferroelectric random access memory (RAM) is one example. Some others include magneto-resistive RAM, organic RAM, phase change RAM and conductive bridging RAM, and so on. Two-terminal memory technologies have differing advantages and disadvantages, and trade-offs between advantages and disadvantages are common. For instance, various subsets of these devices can have relatively fast switching times, good durability, high memory density, low cost fabrication, long life, or the like, or combinations thereof. Meanwhile, the various subsets can also be difficult to fabricate, have compatibility problems with many common CMOS fabrication processes, poor read performance, small on/off resistance ratios, small on/off resistance ratios (e.g., leading to small sensing margin) or poor thermal stability, as well as other problems. Though resistive-switching memory technology is considered by the inventors to be one of the best technologies having the most benefits and least detriments, other two-terminal memory technologies capable of being operated with volatile characteristics in response to an external stimulus, can be utilized for some of the disclosed embodiments, where suitable to one of ordinary skill in the art.

Overview

The volatile element of disclosed non-volatile memory cells, the selector device, can have a low resistance state and a high resistance state based on the voltage being applied by the voltage source to the first terminal of the capacitor. Between a range of deactivation voltages (e.g., from a negative threshold voltage to a positive threshold voltage, or other suitable positive range, negative range, or range spanning positive and negative voltages) the resistance can be very high, whereas outside the range of deactivation voltages, the resistance can be much lower, facilitating current flow (and charge transfer) across the selector device. As a magnitude of voltage across the selector device, starting within the range of deactivation voltages, is increased (e.g., increasing with time), charge first accumulates very slowly on the gate of the MOS transistor connected to a second terminal of the selector device. Once the magnitude of the voltage leaves the range of deactivation voltages and exceeds a first threshold voltage (e.g., a positive threshold, or a narrow range of positive threshold voltages), the selector device enters the low resistance state and conducts current to the MOS transistor, enabling charge to accumulate much more quickly on the gate of the MOS transistor. As the voltage decreases below the positive threshold (or narrow range of positive threshold voltages), the selective device enters the high resistance state and becomes non-conductive. The non-conductivity of the selector device serves to trap charge that accumulated at the gate of the MOS transistor as stated above. When the voltage source returns to zero, the charge trapped at the gate of the MOS transistor can still remain, resulting in a measurable potential difference greater than zero (e.g., about 0.5 volts, about 0.75 volts, about 1 volt, or any other suitable voltage measurably distinct from zero). This trapped measurable charge can cause the MOS transistor to be in a second state, different from a first state in which less charge is trapped at the gate of the MOS transistor. The two states of the MOS transistor provide a bit of non-volatile storage.

In an erase cycle, a decreasing negative voltage is applied, and while the selector device is in a high resistance state, charge at the gate of the MOS transistor decreases slowly. Once the selector device switches to the low resistance state, the charge decreases more rapidly with decreasing negative voltage. The selector device switching to the low resistance state occurs when the decreasing negative voltage again leaves the range of deactivation voltages (e.g., drops below a negative threshold voltage, or narrow range of negative threshold voltages). The positive charge generated by the positive voltage (described above) decreases rapidly (e.g., is replaced by a negative charge in some embodiments) and changes a state of the MOS transistor from the second state back to the first state. In some embodiments, negative charge accumulates quickly with the selector device in the low resistance state, and then as the applied voltage returns to zero and the selector device returns to the high resistant state, a negative charge remains accumulated on the gate of the MOS transistor. Since the current leakage of the selector device can be very low (e.g., measured in atto-amps in at least some disclosed embodiments), the charge on the gate of the MOS transistor can retain a magnitude suitable to maintain the changed state of the MOS transistor for a long period of time. These two different stable states of positive charge and negative charge accumulation on the gate of the MOS transistor provide non-volatile characteristics for the disclosed memory cells.

Non-Limiting Examples a Non-Volatile Memory Cell Utilizing Volatile Switching Two Terminal Device and a MOS Transistor Various aspects or features of this disclosure are described with reference to the drawings, wherein like reference numerals are used to refer to like elements throughout. In this specification, numerous specific details are set forth in order to provide a thorough understanding of this disclosure. It should be understood, however, that certain aspects of disclosure may be practiced without these specific details, or with other methods, components, materials, etc. In other instances, well-known structures and devices are shown in block diagram form to facilitate describing the subject disclosure.

Referring now to the drawings, in FIG. 1, illustrated is a schematic diagram 100 of a neuromorphic application of a memory array 102 in accordance with various aspects described herein. In the embodiment shown in the FIG. 1, a set of resistive switching memory cell devices (Shown as R0, R1, R2, R3, R4, R5, R6, and R7) are at an intersection of a set of bitlines 104, 106, 108 and wordlines 112.

In various embodiments, the resistive switching memory cells can include a selector device that may be embodied as a Field-Assisted Superlinear Threshold (FAST™) selector device, currently under development by the current assignee of the present patent application and is disclosed in U.S. Non-Provisional application Ser. No. 14/588,185 filed Dec. 31, 2014, the entirety of which is incorporated herein for all purposes.

In various embodiments, the bit lines 104, 106, and 108 and wordlines 112 can form part of a memory array that is used for a variety of purposes, not limited to being a digital to analog converter. For instance, a chip with embedded memory can use a portion of the memory array for storage, cache, or system memory purposes, while using another portion of the memory array as a digital to analog converter, current source, bit counter, and other uses.

In an embodiment, the bitlines 104, 106, and 108 can function as respective neurons, while the set of wordlines 112 function as a neuron as well. The set of four resistive switching memory cell devices, 110 can then function as synapses between the neurons.

During a programming, or learning phase, where the voltage applied across the bitlines is above a predetermined programming voltage (e.g., 2.8-3.0V) the resistive switching memory devices can be set to different resistive states. In an embodiment, the resistive switching memory devices that are even numbered in FIG. 1, e.g., R4, R6, R0 and R2, are set to low resistance states, while the resistors that are odd numbered, R5, R7, R1, and R3 can be set to a high resistance state during the programming phase. In other embodiments, different numbers and combinations of resistors can be programmed to a high or low resistant state. In an embodiment, the resistive states of the resistive switching memory devices can be selected such that a predetermined current through the bitlines 104, 106 and 108 is measured. The state of the resistive switching memory cell devices defining a synapse can determine conduction of current between two neurons. In an embodiment, the conduction level is a learned experience and as such, it's programmed into the synapse. The number of resistive switching memory cell devices in a synapse determine the sensitivity and accuracy of the conduction.

In the embodiment shown in FIG. 1, bitline 108 can receive an input from a single sensor and the voltage applied to the bitline is based on a magnitude of the sensor input. For instance, if the sensor measures temperature—a higher voltage can indicate a higher temperature and vice versa. The voltage response to the sensor input may not be a linear response, but some other response, logarithmic, exponential etc, and the neuromorphic functioning of the memory array can map the non-linear voltage response to a linear current response.

Figure 2:
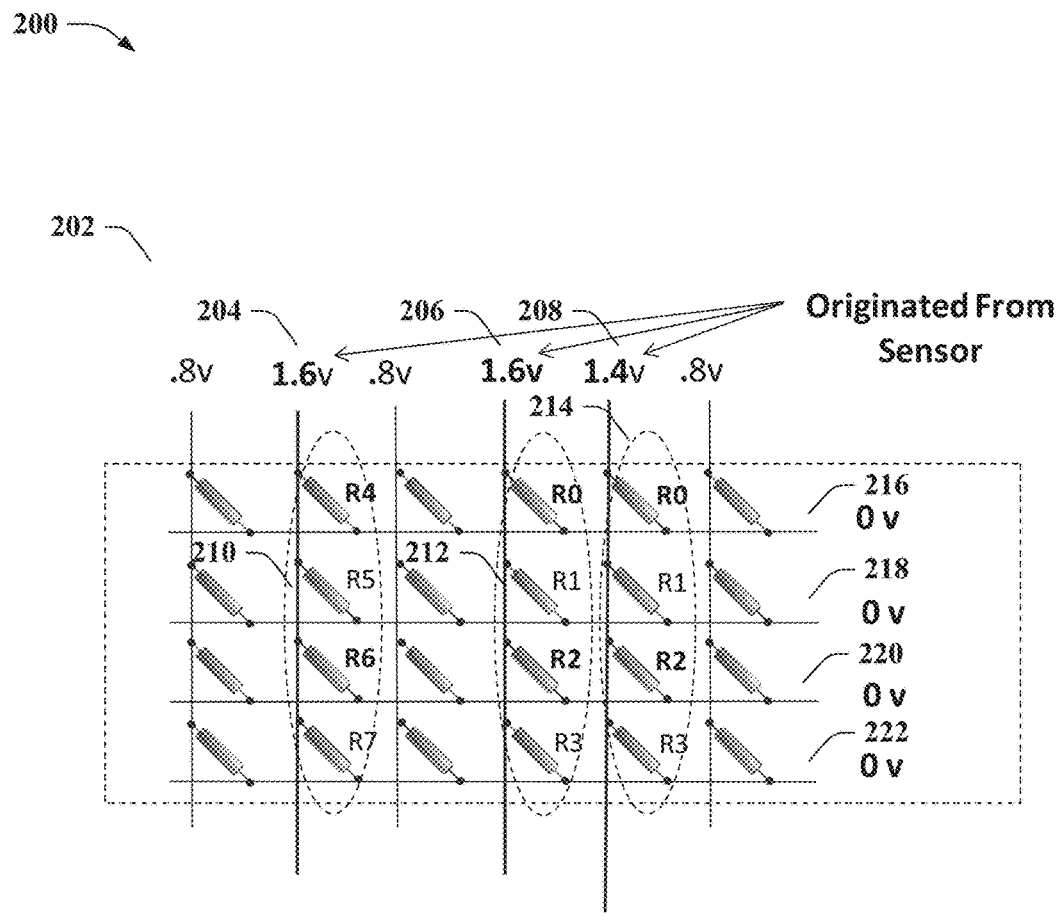
FIG. 2 illustrates a schematic diagram of another neuromorphic application of a memory array in accordance with various aspects described herein.

FIG. 2 illustrates a schematic diagram 200 of a neuromorphic application of a memory array 202 in accordance with various aspects described herein. The memory array 202 is shown to include three sets of resistive switching memory cell devices 210, 212 and 214 between bitlines 204, 206, and 208 and wordlines 216, 218, 220, and 222 to illustrate different examples of a neuromorphic application. In an embodiment, the bitlines 204, 206, and 208 can function as respective neurons, while the set of four wordlines 216, 218, 220, and 222 function as a neuron as well. Each set of four resistive switching memory cell devices, 210, 212, and 214 can then function as synapses between the neurons. As an example, FIG. 2 illustrates three different synapses (sets of resistive switching devices 210, 212, and 214) sharing the same wordlines 216, 218, 22, 222 and forming part of memory array 202. In other embodiments, memory array 202 can be formed from a different number of wordlines and bitlines and can include different numbers of synapses formed by sets of resistive switching devices.

During a programming, or learning phase, where the voltage applied across the bitlines is above a predetermined programming voltage (e.g., 2.8-3.0V) the resistive switching memory devices can be set to different resistive states. In an embodiment, the resistive switching memory devices that are even numbered in FIG. 2, e.g., R4, R6, R0 and R2, are set to low resistance states, while the resistors that are odd numbered, R5, R7, R1, and R3 can be set to a high resistance state during the programming phase. In other embodiments, different numbers and combinations of resistors can be programmed to a high or low resistant state. In an embodiment, the resistive states of the resistive switching memory devices can be selected such that a predetermined current through the bitlines 204, 206, and 208 is measured. The state of the resistive switching memory cell devices defining a synapse can determine conduction of current between two neurons. In an embodiment, the conduction level is a learned experience and as such, it's programmed into the synapse. The number of resistive switching memory cell devices in a synapse determine the sensitivity and accuracy of the conduction.

Bitlines 204, 206, and 208 can each receive inputs from a single sensor and the voltage applied to the bitline is based on a magnitude of the sensor input. For instance, if the sensor measures temperature—a higher voltage can indicate a higher temperature and vice versa. The voltage response to the sensor input may not be a linear response, but some other response, logarithmic, exponential etc, and the neuromorphic functioning of the memory array can map the non-linear voltage response to a linear current response.

In an embodiment, bitline 204 and 206 can receive the same voltage input from the sensor, 1.6V, and even though the resistive switching memory devices are set to different resistances, the current measured on the bitlines will be the same. In other words the total current measured through the set of resistive switching memory cell devices 210 and 212 will be $I=(1.6V/R_4)+(1.6V/R_6)=(1.6V/R_0)+(1.6V/R_2)$.

In another embodiment, the bitline 206 and 208 will receive different voltage inputs even though the learning of the resistive switching memory cell devices 212 and 214 is the same. A coefficient applied to the current measured at the 214 set of resistive switching memory cell devices will reflect the change in voltage input. The coefficient represents the amplification needed for the current measured in bitline 208 to equal the current measured in 206, and is thus representative of the overall amplitude of the sensor input. Since the sensor input on bitline 208 is only 1.4V, while the sensor input on bitline 206 is 1.6V, the current measured on 208 will be lower, and the coefficient (K) can be the amplification factor to equalize the output (current). The coefficient K can thus be similar to the gain in sensor systems. In an embodiment, the current on bitline 206 can be $I=I_0+I_2$, while the current on bitline 208 can be $I=K(I_{0'}+I_{2'})$.

It is to be appreciated that resistive switching devices R1 and R3 may also have a very small current passing through them, the level of current is negligible. This is due to the fact that although the resistance of the R1 and R3 is very high, it is not infinite, and so some current will pass through. In other embodiments, the bitlines can receive inputs from different sensors.

Figure 3:
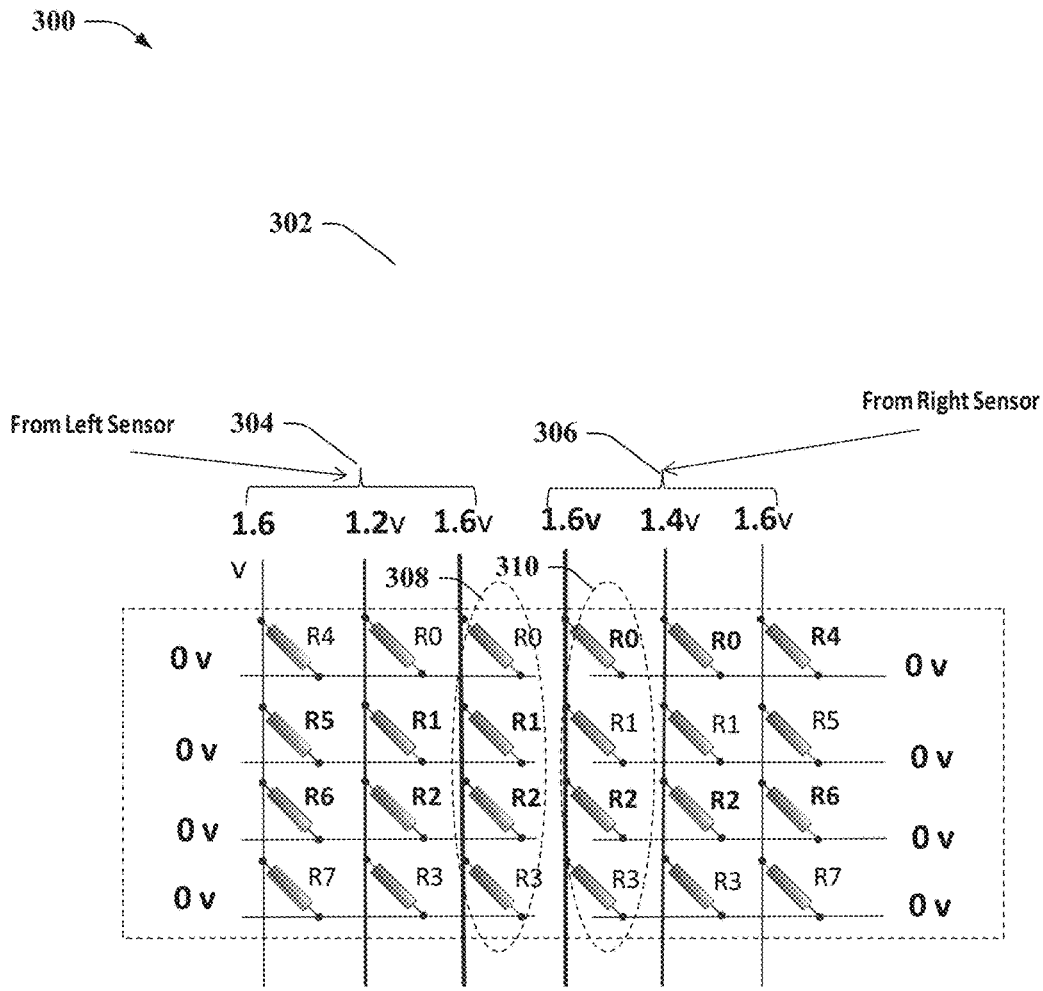
FIG. 3 illustrates a schematic diagram of another neuromorphic application of a memory array in accordance with various aspects described herein.

FIG. 3 illustrates a schematic diagram 300 of another neuromorphic application of a memory array 302 in accordance with various aspects described herein. In the embodiment shown in FIG. 3, the voltages applied to sets of bitlines 304 and 306 correspond to sensory inputs from a first and second sensor. In the embodiment shown here, the first sensor is a left sensor, and the second sensor is a right sensor. The synapses 308 and 310 can correspond to synapses for similar sensors, and can also have different programmed resistive values, as the R1 and R2 are in a lower resistive state in synapse 308, while R0 and R2 have a lower resistive state in synapse 310.

In an embodiment, the different currents measured by the left and the right sensor can be used to determine a location of a sensory event that led to the sensory input, the depth of the sensory event, and/or the direction of the sensory event.

Figure 4:
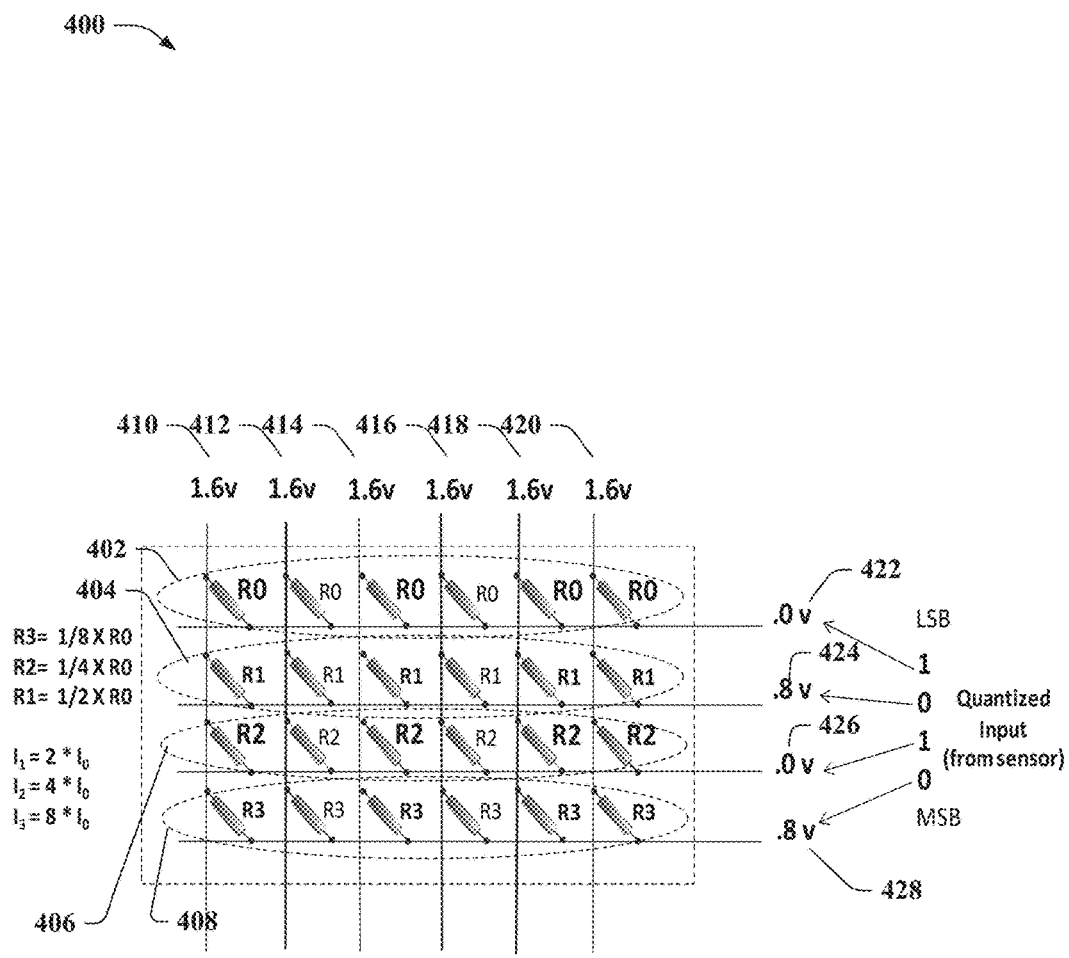
FIG. 4 illustrates a schematic diagram of a neuromorphic application of a memory array in accordance with various aspects described herein.

FIG. 4 illustrates a schematic diagram of another neuromorphic application of a memory array 400 in accordance with various aspects described herein. In the embodiment shown in FIG. 4, the rows (402, 404, 406, and 408) of resistive switching memory devices collectively form a synapse. While in the embodiment shown in FIG. 2, the sensor input is received via the bitlines, the sensor input, digitized, is received via the wordlines 422, 424, 426, and 428, with wordline 422 being the least significant bit of the set of bits, and wordline 426 being the most significant bit. The output of the sensor is the sum of the currents measured on the bitlines 410, 412, 414, 416, 418, and 420.

During a programming phase, the resistive states of the resistive switching memory cells can be set to R0, R1, R2, or R3, where R1 is ½ of R0, R2 is ¼ of R0 and R3 is ⅛ of R0. In the embodiment shown in FIG. 4, resistive switching devices that are bolded have been programmed, while resistive switches not bolded, such as the resistive switching devices in bitline 412 and 416 have not been programmed. Resistive switching devices on wordlines 424 and 428 are not activated as the bit is 0 which gives a voltage of 0.8V. The voltage differential of 1.6V-0.8V is only 0.8V which is not high enough to activate the resistive switching memory cells, and so the resistance of these resistive switching devices on wordlines 424 and 428 is very high, giving a negligible current. The current measured in bitlines 410, 414, 418, and 420 is thus I0+I2, which is the current that passes through the resistive switching device at the intersection of those bitlines and wordlines 422 and 426. Resistive switching devices that are bolded and have a larger font are ones (e.g., R0s and R2s in bitlines 410, 414, 418, and 420) that have been programmed as part of a learning process and have been selected by a digitized input from a sensor.

In one embodiment, resistive switching devices of rows 402, 404, 406, and 408 can collectively define a synapse and conduction of current between the neuron. The wordlines of array 400 define one neuron and the bitlines of array 400 define the other neuron, with the resistive switching devices determining the current conduction.

In another embodiment of the invention, the resistive switching devices of rows 402, 404, 406, and 408 are programmed to the same value; that is, each row can have a similar value to the other rows. In yet another embodiment, synapse rows of resistive switching devices are formed across the wordlines and quantized input from the sensor is applied to the bitlines.

Figure 5:
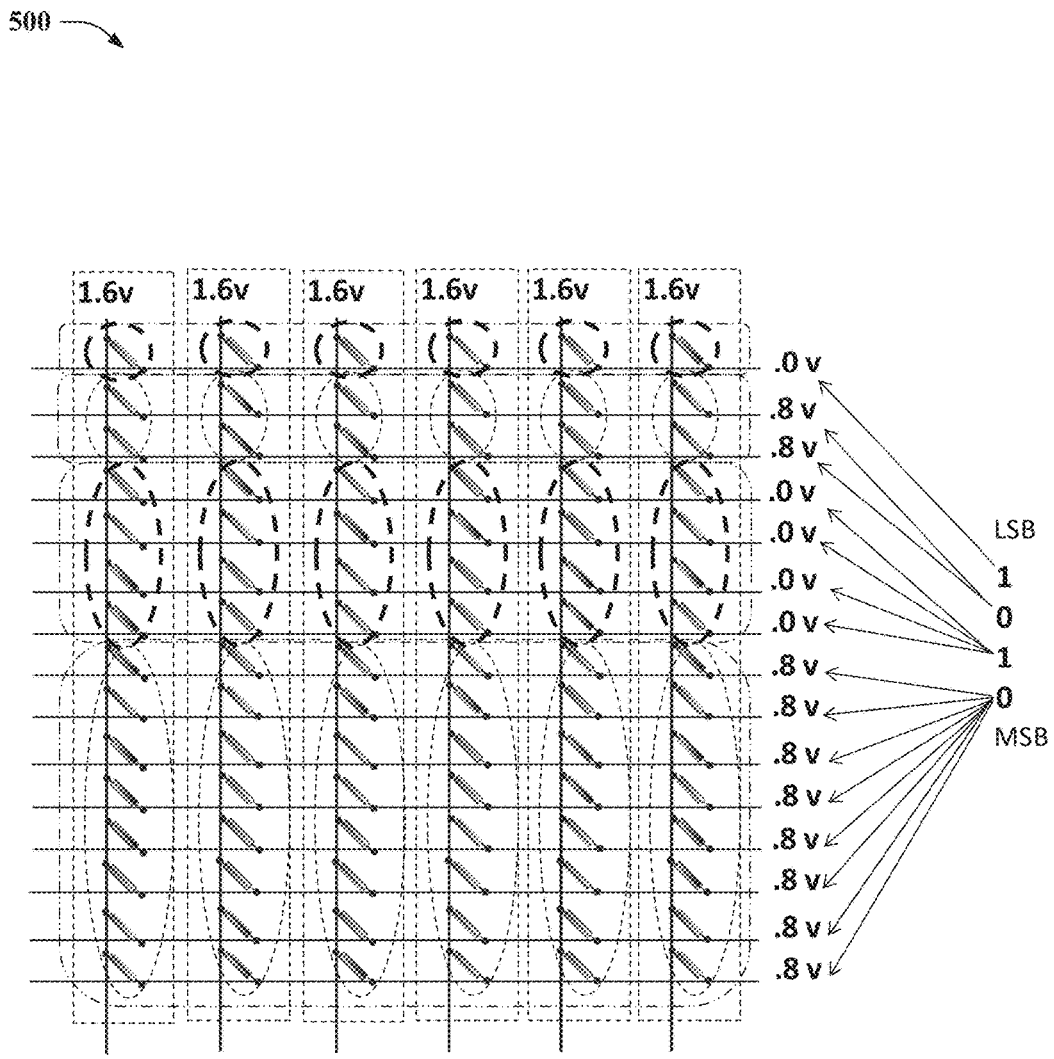
FIG. 5 illustrates a schematic diagram of another neuromorphic application of a memory array in accordance with various aspects described herein.

FIG. 5 illustrates a schematic diagram of a memory array 500 of another neuromorphic application in accordance with various aspects described herein. FIG. 5 depicts a similar embodiment of the neuromorphic application shown in FIG. 4, except that while the embodiment in FIG. 4 shows resistive switching memory devices that are able to be programmed to a variety of resistive states (e.g., multi-level cells having different programmable resistance values: e.g., R3=⅛×R0, R2=¼×R0, R1=½×R0, etc. as depicted by FIG. 4), the resistive switching memory cells in memory array 500 are single state resistive switching memory cells, capable of either being programmed to a high resistive state or a low resistive state. Thus, the multi-level cells of FIG. 4 are modeled in memory array 500 using different numbers of resistive switching memory devices having a common low resistance value (or a high resistance value).

Figure 6:
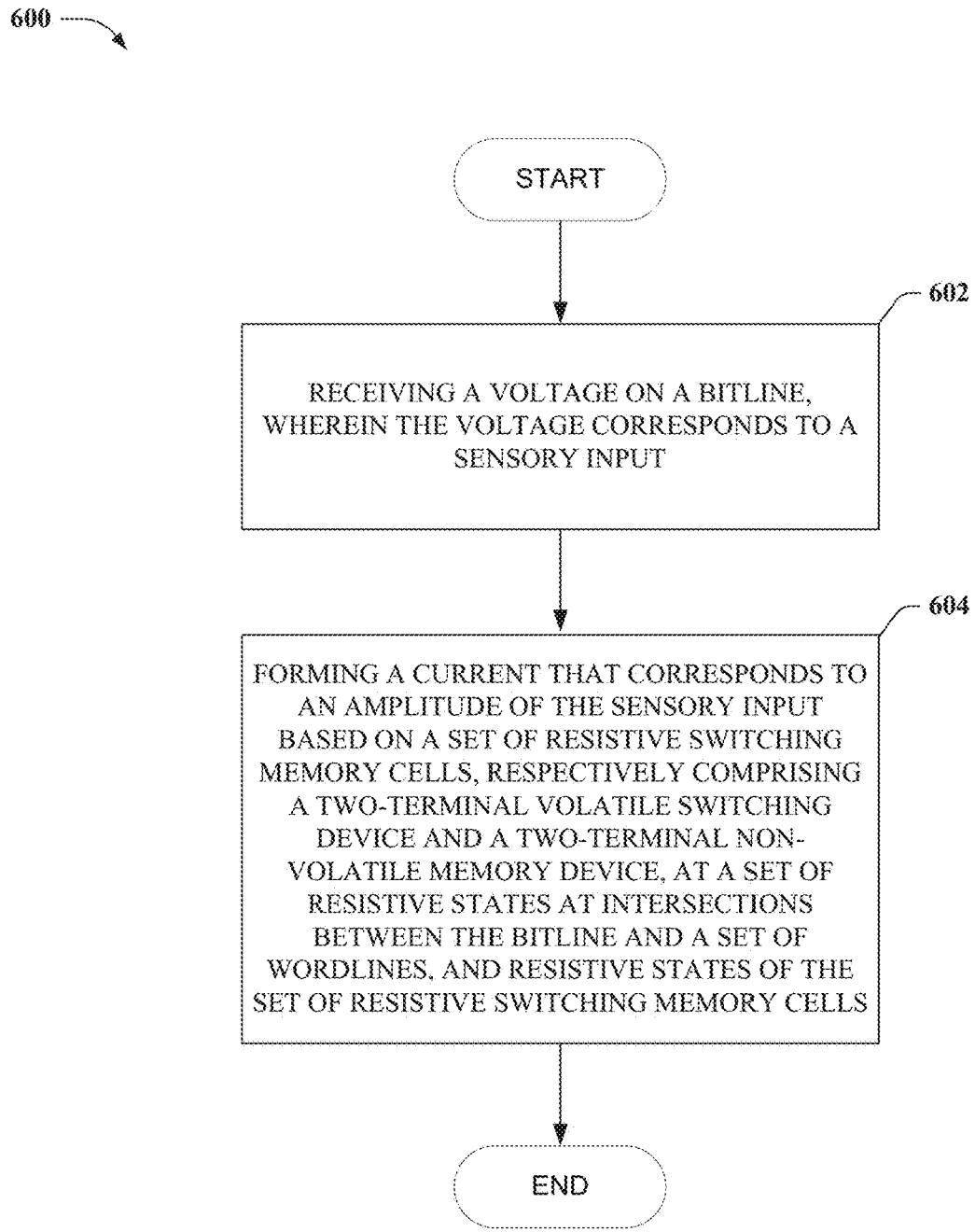
FIG. 6 illustrates an exemplary flowchart of method for applying neuromorphic logic in accordance with various aspects described herein.
Figure 7:
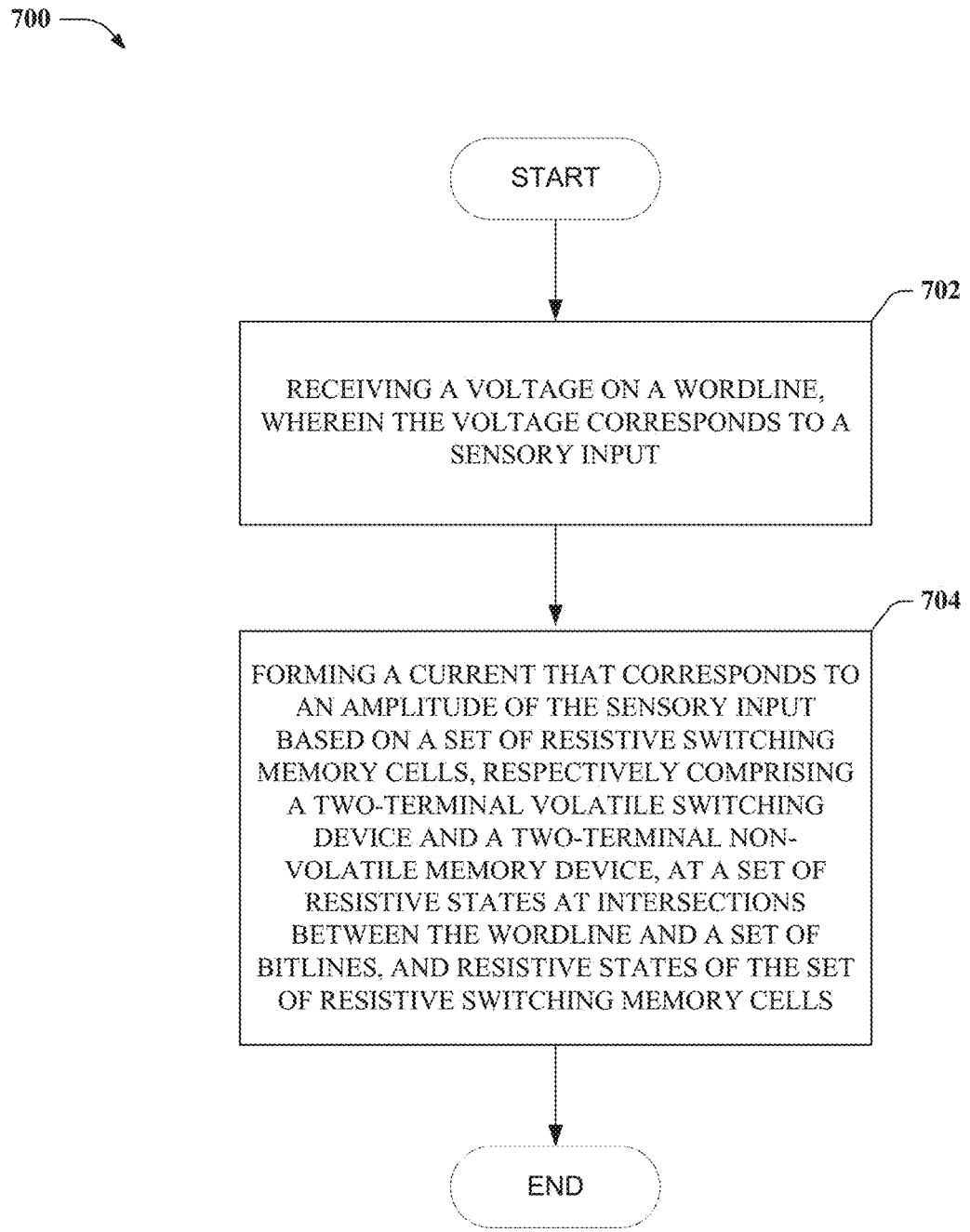
FIG. 7 illustrates an exemplary flowchart of method for applying neuromorphic logic in accordance with various aspects described herein.

FIG. 6 and FIG. 7 illustrate processes in connection with the system illustrated in FIGS. 1-5. The processes in FIG. 6 and FIG. 7 can be implemented for example by systems 100-500.

FIG. 6 illustrates an exemplary flowchart of method for applying neuromorphic logic in accordance with various aspects described herein.

At 602, the method includes receiving a voltage on a bitline, wherein the voltage corresponds to a sensory input. At 604, the method includes forming a current that corresponds to an amplitude of the sensory input based on a set of resistive switching memory cells, respectively comprising a two-terminal volatile switching device and a two-terminal non-volatile memory device, at a set of resistive states at intersections between the bitline and a set of wordlines, and resistive states of the set of resistive switching memory cells.

FIG. 7 illustrates another exemplary flowchart of method for applying neuromorphic logic in accordance with various aspects described herein.

At 702 the method includes receiving a voltage on a wordline, wherein the voltage corresponds to a sensory input. At 704 the method includes forming a current that corresponds to an amplitude of the sensory input based on a set of resistive switching memory cells, respectively comprising a two-terminal volatile switching device and a two-terminal non-volatile memory device, at a set of resistive states at intersections between the wordline and a set of bitlines, and resistive states of the set of resistive switching memory cells.

Figure 8:
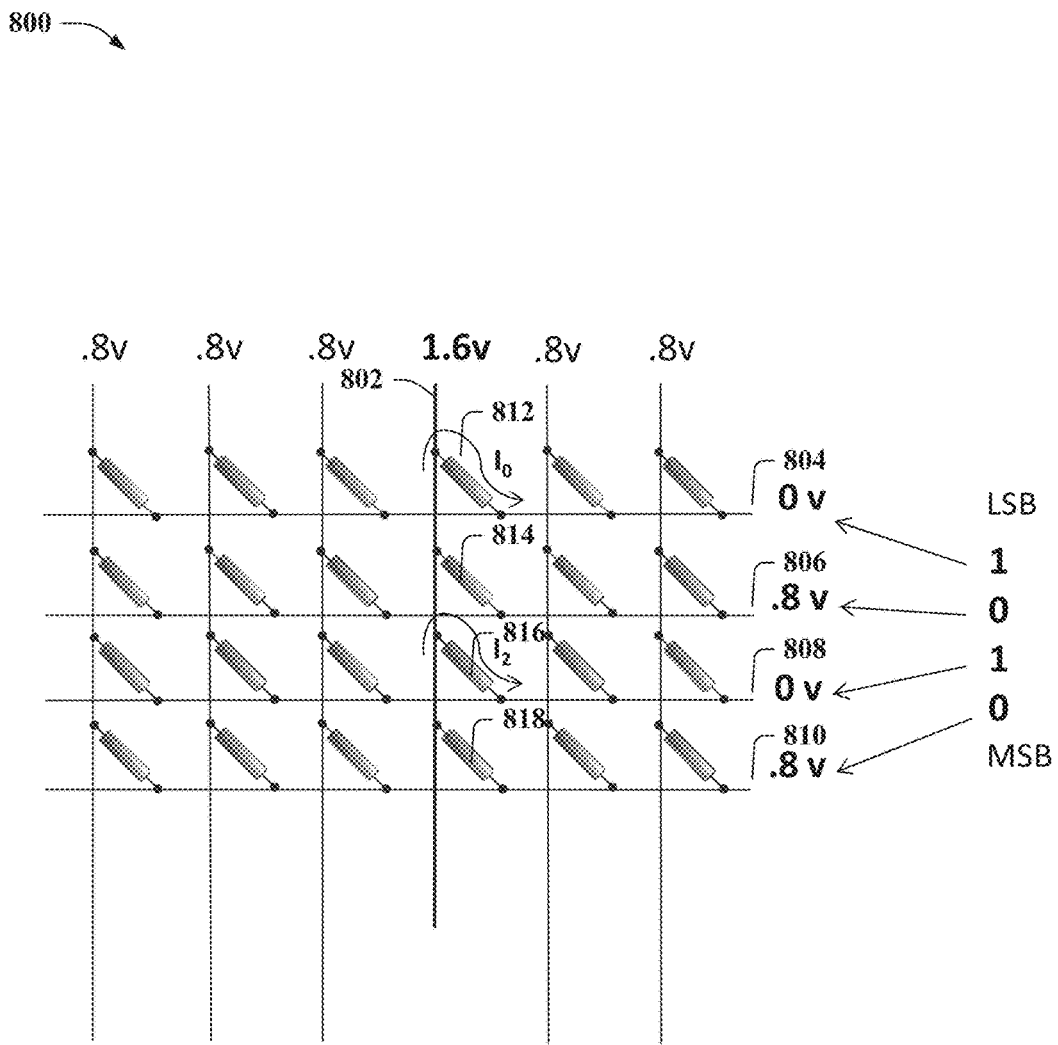
FIG. 8 illustrates a schematic diagram of an example digital to analog converter in accordance with various aspects described herein.

FIG. 8 illustrates a schematic diagram of an example digital to analog converter 800 in accordance with various aspects described herein. The digital to analog converter 800 can be formed from a portion of a memory array. Resistive switching memory cells (e.g., 812, 814, 816, and 818) can be formed between a bitline 802 and a set of wordlines 804, 806, 808, and 810. Each of the resistive switching memory cells can comprise a two-terminal memory device and/or a selector device.

In an embodiment, if a voltage above a predetermined threshold is applied across the resistive switching memory cell, the cell becomes 'active' and will conduct electricity. In an embodiment, the threshold voltage can be between 1 and 1.5 V, and in other embodiments, other threshold voltages are possible. The resistive switching memory cells can also be programmed to one or more different resistive states, such that when the threshold voltage is applied and the cells become conductive, the cells will have various resistances depending on the programmed resistive state of the resistive switching memory cell.

In an embodiment, the set of resistive switching memory cells 812, 814, 816, and 818 can function as a digital to analog converter by receiving a digital input via the wordlines 804, 806, 808, and 810. Each of the wordlines 804, 806, 808, and 810 can correspond to a bit of a set of bits of the digital input. In the example shown in FIG. 8, there can be four bits received via the digital input, with wordline 804 being associated with the least significant bit, and wordline 810 being associated with the most significant bit. If the bit is a 1, there can be zero volts applied to the wordline, and if the bit is 0, there can be 0.8V applied to the wordline. Since the activation threshold is around 1-1.5V, when there is no voltage applied to wordline 804, the difference in voltage across resistive switching memory cell 812 is 1.6V, and the memory cell 812 is activated and correspondingly conducts current. Since the bit associated with wordline 806 is 0, there is a 0.8V voltage applied to the wordline 806, and the voltage differential across memory cell 814 is 1.6V-0.8V=0.8V which means that the resistive switching memory cell 814 is not activated, and thus does not conduct any current. Similarly, resistive switching memory cell 816 conducts current, and memory cell 810 does not conduct current.

Since each of the memory cells 812, 814, 816, and 818 can have different resistive states with different resistances, the total current through the bitline will change depending on the bits of the digital input. In an embodiment, resistive switching memory cell 812 can have a resistance of $R_0$, with resistive switching memory cell 814 having a resistance of $R_0/2$, resistive switching memory cell 816 having a resistance of $R_0/4$, and resistive switching memory cell 818 having a resistance of $R_0/8$. Since the current passing through each of the memory cells is inversely proportional to the resistance, the current that passes through resistive switching memory cell 812 is $I_0$ while the current that passes through the other activated memory cell, resistive switching memory cell 816 is $4 \times I_0$, giving a total current of $5I_0$. In this case, since the wordline 808 corresponds to a more significant bit than wordline 804, the relative current passing through each memory cell also is different, and is based on the significance of the bits.

In an embodiment, the resistive states of the resistive switching memory cells can be programmed during a configuration step where specific relative voltages across each resistive switching memory cell can set the resistive states of the memory cells. In other embodiments, the bitline 802 can include different numbers of resistors with different resistive states, and in general, more resistive switching memory cells will provide greater accuracy in converting the digital input into an analog output as measured by the current. In an embodiment, the digital input can change at predetermined intervals, with the new set of bits activating different resistive switching memory cells, which can cause a change in current. Thus the changing current is the analog equivalent to the digital input.

In various embodiments, the resistive switching memory cells can include a selector device that may be embodied as a Field-Assisted Superlinear Threshold (FAST™) selector device, currently under development by the current assignee of the present patent application and is disclosed in U.S. Non-Provisional application Ser. No. 14/588,185 filed Dec. 31, 2014, the entirety of which is incorporated herein for all purposes.

In various embodiments, the bit line 802 and wordlines 804, 806, 808, and 810 can form part of a memory array that is used for a variety of purposes, not limited to being a digital to analog converter. For instance, a chip with embedded memory can use a portion of the memory array for storage, cache, or system memory purposes, while using another portion of the memory array as a digital to analog converter.

Figure 9:
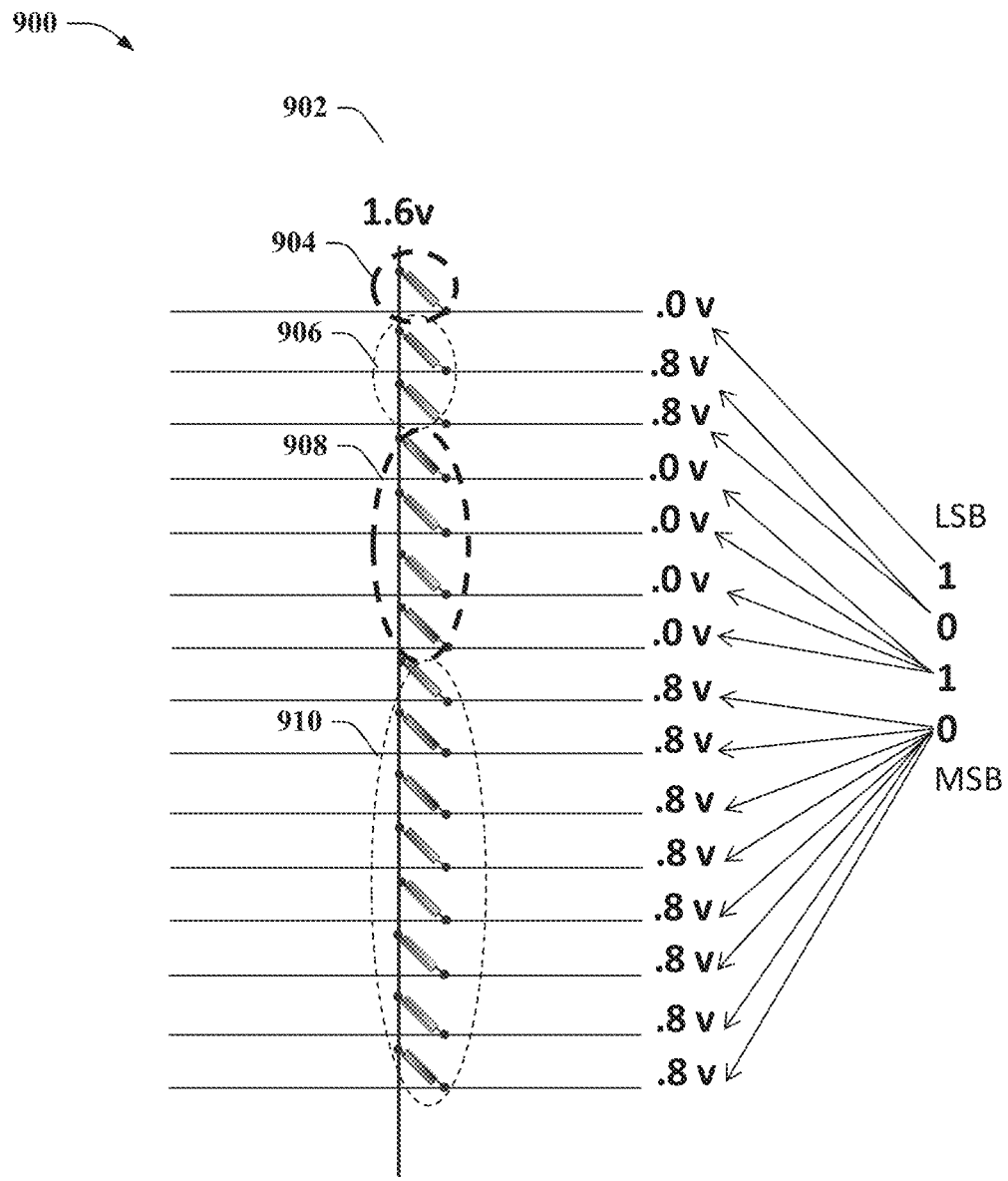
FIG. 9 illustrates a schematic diagram of an example digital to analog converter in accordance with various aspects described herein.

Turning to FIG. 9, illustrated is a schematic diagram 900 of another example digital to analog converter 902 in accordance with various aspects described herein. In the embodiment shown in FIG. 9, each of the resistive switching memory cells can have the same resistive state, where different numbers of each resistive switching memory cells are assigned to each bit based on the significance of the bit. So, resistive switching memory cell 904 corresponds to the least significant bit, set 906 of two resistive switching memory cells corresponds to the next bit, set 908 of four resistive switching memory cells corresponds to the next bit, and set 910 of eight resistive switching memory cells corresponds to the most significant bit. Therefore, when the second most significant bit of 1 activates the set 908 of resistive switching memory cells, the current measured through each of them is $I_0$, giving a total current of $4I_0$. Similarly, when set 904 of the single resistive switching memory cell is activated, the current $I_0$ that passes through the resistive memory cell is added to the $4I_0$ giving a total of $5I_0$, the same current in the embodiment in FIG. 8.

Figure 10:
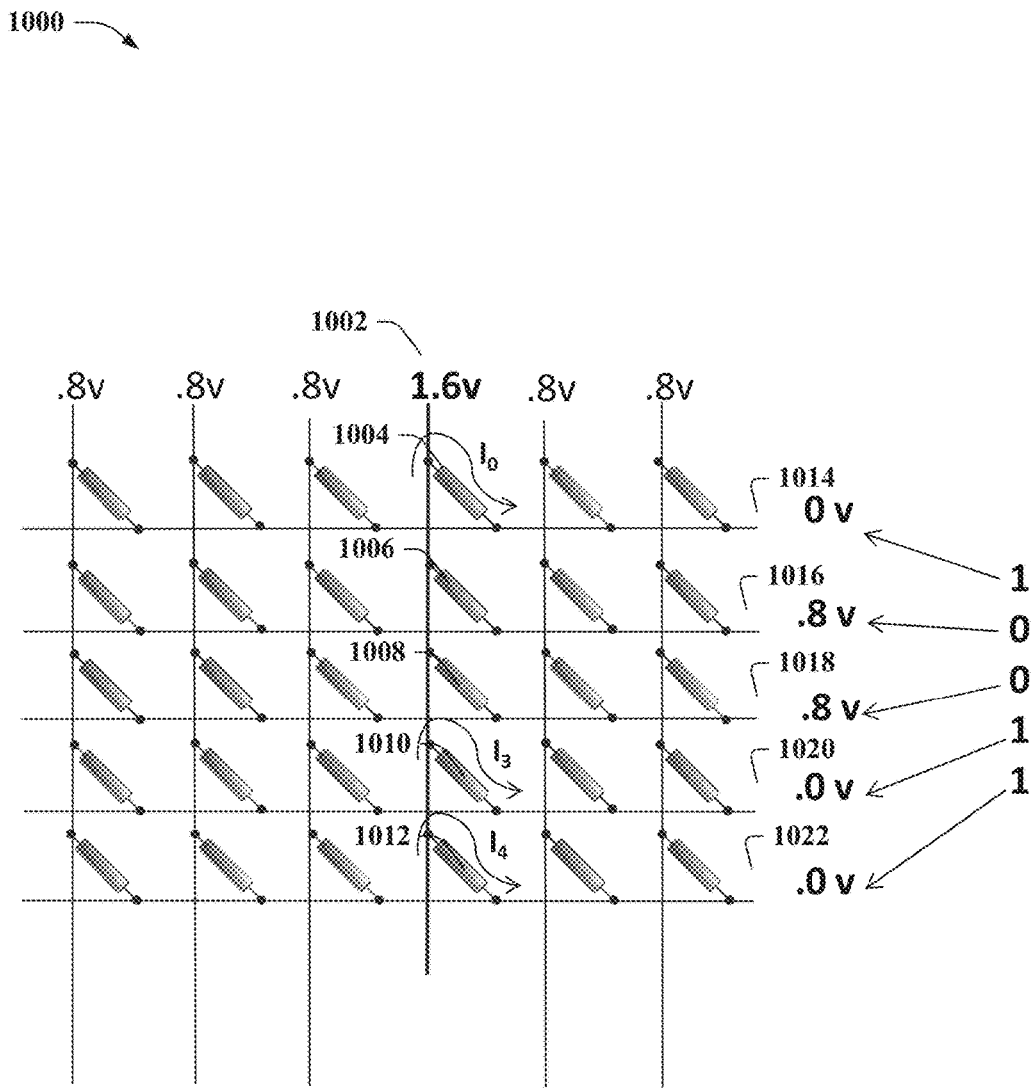
FIG. 10 illustrates a schematic diagram of a bit counter in accordance with various aspects described herein.

Turning now to FIG. 10, illustrated is a schematic diagram of a bit counter 1000 in accordance with various aspects described herein. The bit counter 1000 can be formed from a portion of a memory array. Resistive switching memory cells (e.g., 1004, 1006, 1008, 1010, and 1012) can be formed between a bitline 1002 and a set of wordlines 1014, 1016, 1018, 1020, and 1022 respectively. Each of the resistive switching memory cells can comprise a two-terminal memory device and/or a selector device.

In an embodiment, if a voltage above a predetermined threshold is applied across the resistive switching memory cell, the cell becomes 'active' and will conduct electricity. In an embodiment, the threshold voltage can be between 1 and 1.5 V, and in other embodiments, other threshold voltages are possible. In an embodiment, the set of resistive switching memory cells 1004, 1006, 1008, 1010, and 1012 can function as a bit counter by receiving a digital input via the wordlines 1014, 1016, 1018, 1020, and 1022. Each of the wordlines 1014, 1016, 1018, 1020, and 1022 can correspond to a bit of a set of bits of the digital input.

In the example shown in FIG. 10, there can be five bits received via the digital input. If the value of bit is true or "on", there can be zero volts applied to the wordline, and if the bit is false, or "off", there can be 0.8V applied to the wordline. Since the activation threshold is around 1-1.5V, when there is no voltage applied to wordline 1014 since the bit is on, the difference in voltage across resistive switching memory cell 1004 is 1.6V, and the memory cell 1004 is activated and correspondingly conducts current. Since the bit associated with wordline 1016 is off, there is a 0.8V voltage applied to the wordline 1016, and the voltage differential across memory cell 1006 is 1.6V-0.8V=0.8V which means that the resistive switching memory cell 1006 is not activated, and thus does not conduct any current. Similarly, resistive switching memory cell 1008 does not conduct current, and memory cells 1010 and 1012 do conduct current.

In an embodiment, each of the memory cells 1004, 1006, 1008, 1010, and 1012 can have the same resistive state, and so will conduct a similar amount of current, which can be defined as a base current. A current meter or counter can then be provided to measure the current across the bitline 1002 or the sum of the current across the word lines 1014, 1016, 1018, 1020, and 1022. Dividing the total current by the baseline current can then yield the number of bits that are true/on.

Figure 11:
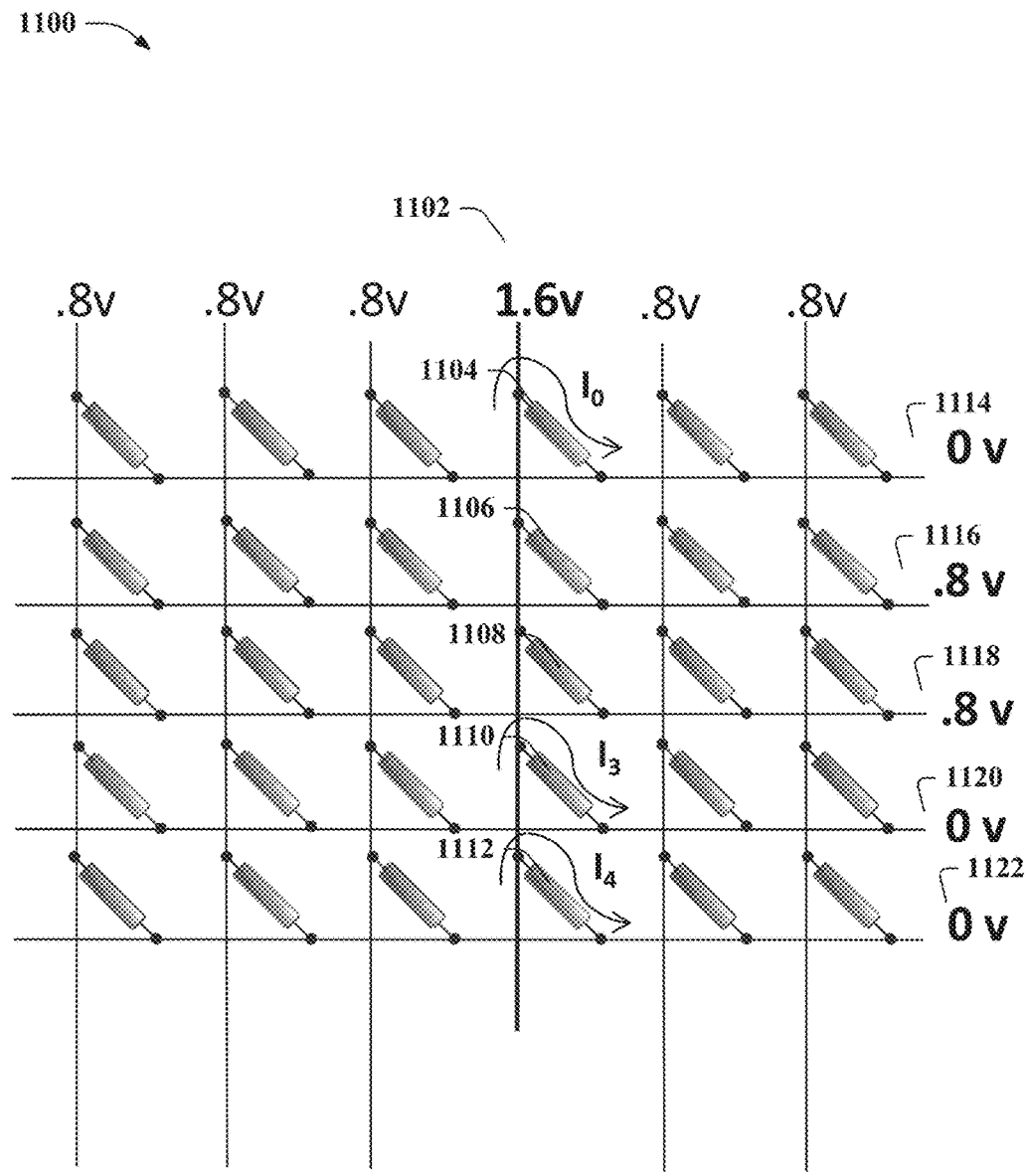
FIG. 11 illustrates a schematic diagram of an exemplary current source in accordance with various aspects described herein.

Turning now to FIG. 11, illustrated is a schematic diagram of an example memory array that can function as a current source 1100 in accordance with various aspects described herein. The current source 1100 can be formed from a portion of a memory array. Resistive switching memory cells (e.g., 1104, 1106, 1108, 1110, and 1112) can be formed between a bitline 1102 and a set of wordlines 1114, 1116, 1118, 1120, and 1122. Each of the resistive switching memory cells can comprise a two-terminal memory device and/or a selector device.

In an embodiment, if a voltage above a predetermined threshold is applied across the resistive switching memory cell, the cell becomes 'active' and will conduct electricity. In an embodiment, the threshold voltage can be between 1 and 1.5 V, and in other embodiments, other threshold voltages are possible. The resistive switching memory cells can also be programmed to one or more different resistive states, such that when the threshold voltage is applied and the cells become conductive, the cells will have various resistances depending on the programmed resistive state of the resistive switching memory cell.

In an embodiment the memory array can function as a current source by modulating the voltage applied to one or more of the wordlines 1114, 1116, 1118, 1120, and 1122. Since each of the resistive switching memory cells 1104, 1106, 1108, 1110, and 1112 can have a variety of predetermined resistive states, when the memory cells are activated, they will conduct a different amount of current based on the resistive states of the memory cells, and so a specific current can be generated by activating selected wordlines of the set of wordlines 1114, 1116, 1118, 1120, and 1122.

As an example, in an embodiment, memory cell 1104 and 1106 can be programmed to very low resistive states and the resulting current conducted can be large, while the memory cells 1108 and 1110 can be set to medium resistive states with a resulting medium current, and memory cell 1112 can be set to a high resistive state with a resulting small current. In the embodiment shown in FIG. 11, when a zero voltage is applied to the wordlines, the memory cell is activated due to the voltage difference across the memory cell being greater than the threshold voltage of around 1-1.5V. Since zero voltage is applied to wordlines 1114, 1120, and 1122, memory cells 1104, 1110, and 1112 are activated with a resulting current being $I=I_0+I_3+I_4$ with $I_0$ being a large current, $I_3$ being a medium current, and $I_4$ being a small current.

In other embodiments, a larger or smaller number of wordlines and memory cells can be used, with the larger number providing increased accuracy and range in current generation. Various resistive states beyond the types disclosed herein can also provide coarser and finer control over the current source.

Figure 12:
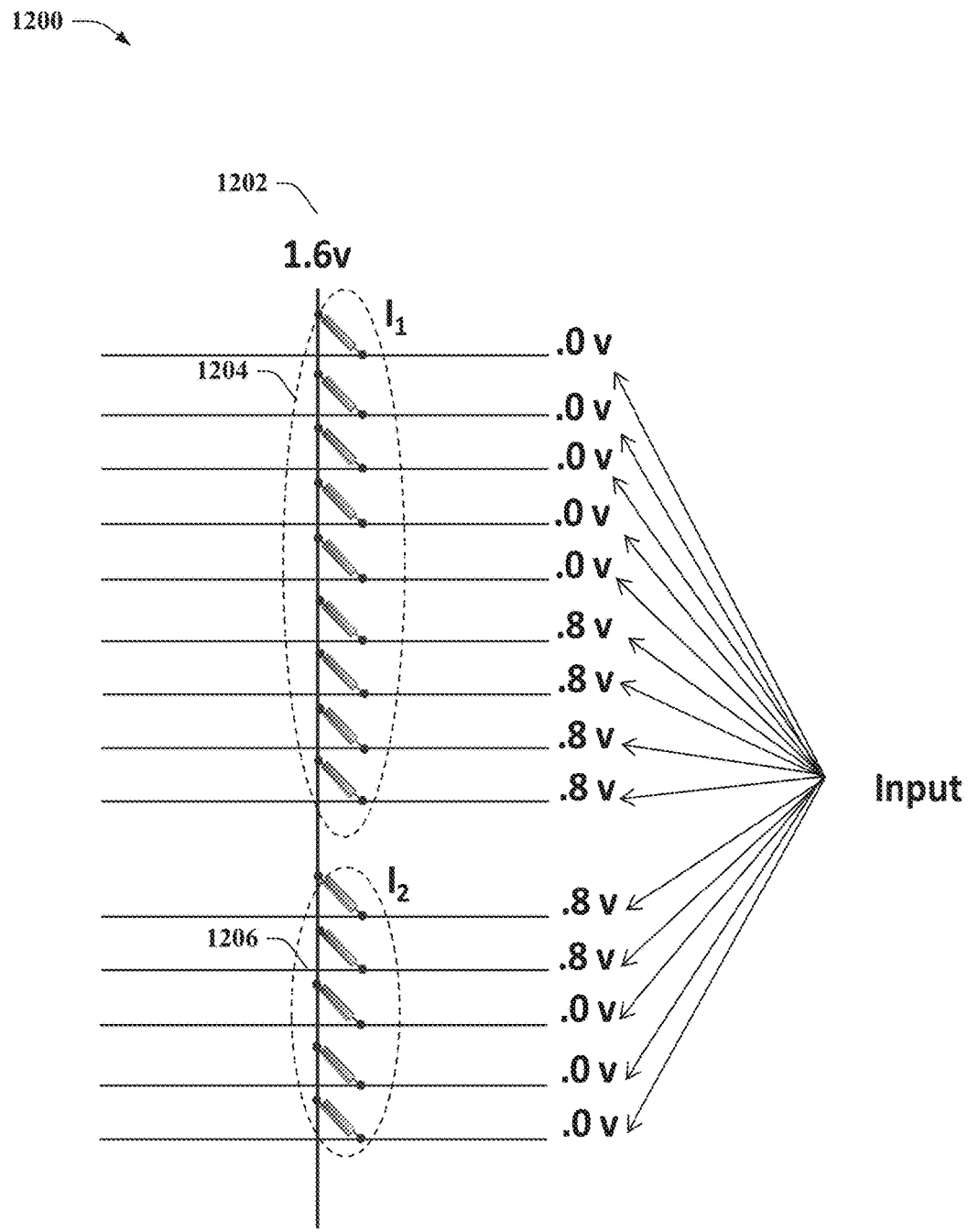
FIG. 12 illustrates a schematic diagram of another exemplary current source in accordance with various aspects described herein.

Turning now to FIG. 12, illustrated is a schematic diagram of another exemplary current source 1200 in accordance with various aspects described herein. In the embodiment shown in FIG. 12, each of the resistive switching memory cells can have the same resistive state, where sets of different numbers of each resistive switching memory cells are can provide coarse and fine control over current generation.

In the embodiment shown in FIG. 12, set of memory cells 1204 can be in a high resistance state and thus provide fine control, while set of memory cells 1206 can be in low resistance state providing coarse control. When the wordlines are modulated, the total current measured on the bit line 1202 is the sum of the current passing through the memory cells 1204 and the memory cells 1206. In the embodiment shown, 5 memory cells of the set 1204 are activated (i.e., have a zero voltage applied to the wordline, resulting in a voltage differential across the bitline that activates the memory cell), and 3 of the memory cells in set 1206 are activated. The current in the bitline 1202 is thus $I=3I_2+5I_1$.

In other embodiments, different numbers of sets of memory cells are possible giving coarser or finer control over current generation than the two sets shown in FIG. 12.

Example Operating Environments

In various embodiments of the subject disclosure, disclosed memory architectures can be employed as a stand-alone or integrated embedded memory device with a CPU or microcomputer. Some embodiments can be implemented, for instance, as part of a computer memory (e.g., random access memory, cache memory, read-only memory, storage memory, or the like). Other embodiments can be implemented, for instance, as a portable memory device. Examples of suitable portable memory devices can include removable memory, such as a secure digital (SD) card, a universal serial bus (USB) memory stick, a compact flash (CF) card, or the like, or suitable combinations of the foregoing. (See, e.g., FIGS. 13 and 14, infra).

NAND FLASH is employed for compact FLASH devices, USB devices, SD cards, solid state drives (SSDs), and storage class memory, as well as other form-factors. Although NAND has proven a successful technology in fueling the drive to scale down to smaller devices and higher chip densities over the past decade, as technology scaled down past 25 nanometer (nm) memory cell technology, the inventors have identified several structural, performance, and reliability problems that became evident to them. These or similar considerations can be addressed by some or all of the disclosed aspects.

Figure 13:
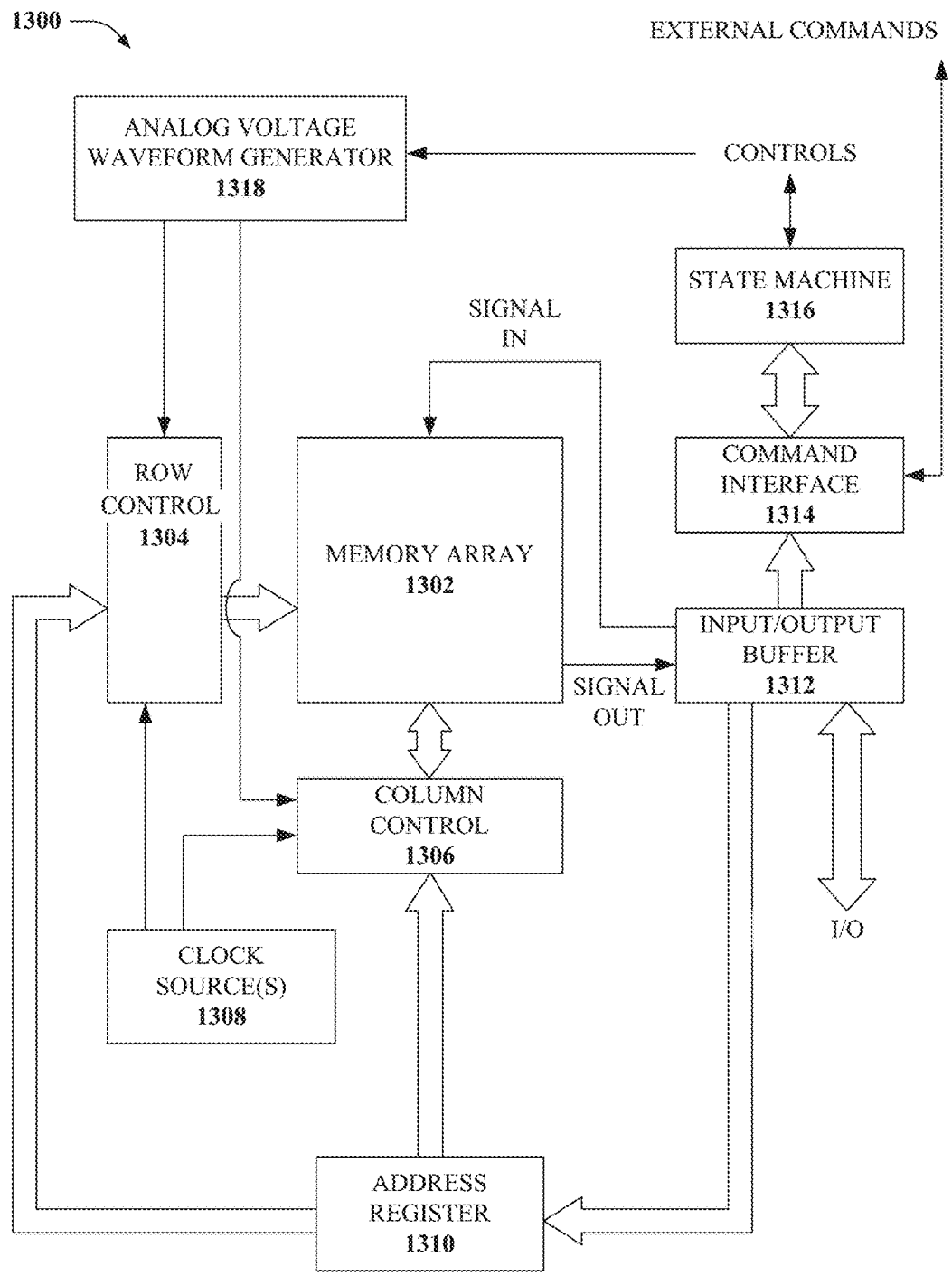
FIG. 13 depicts a block diagram of a sample operating environment for facilitating implementation of one or more aspects disclosed herein.

In order to provide a context for the various aspects of the disclosed subject matter, FIG. 13, as well as the following discussion, is intended to provide a brief, general description of a suitable environment in which various aspects of the disclosed subject matter can be implemented or processed. While the subject matter has been described above in the general context of electronic memory and process methods for fabricating or operating the electronic memory, those skilled in the art will recognize that the subject disclosure also can be implemented in combination with other components/layers of memory, memory architectures or process methodologies. Moreover, those skilled in the art will appreciate that the disclosed processes can be implemented within a processing system or a computer processor, either alone or in conjunction with a host computer, which can include single-processor or multiprocessor computer systems, mini-computing devices, mainframe computers, as well as personal computers, hand-held computing devices (e.g., PDA, smart phone, watch), microprocessor-based or programmable consumer or industrial electronics, and the like. The illustrated aspects may also be practiced in distributed computing environments where tasks are performed by remote processing devices that are linked through a communications network. However, some, if not all aspects of the claimed innovation can be practiced on stand-alone electronic devices, such as a memory card, FLASH memory module, removable memory, or the like. In a distributed computing environment, program modules can be located in both local and remote memory storage modules or devices.

FIG. 13 illustrates a block diagram of an example operating and control environment 1300 for a memory cell array 1302 according to aspects of the subject disclosure. In at least one aspect of the subject disclosure, memory cell array 1302 can comprise a variety of memory cell technology. Particularly, memory cell array 1302 can comprise two-terminal memory such as resistive memory cells with a resistive switching medium formed via ion implantation to a conductive polysilicon material, as described herein.

A column controller 1306 can be formed adjacent to memory cell array 1302. Moreover, column controller 1306 can be electrically coupled with bit lines of memory cell array 1302. Column controller 1306 can control respective bitlines, applying suitable program, erase or read voltages to selected bitlines.

In addition, operating and control environment 1300 can comprise a row controller 1304. Row controller 1304 can be formed adjacent to column controller 1306, and electrically connected with wordlines of memory cell array 1302. Row controller 1304 can select particular rows of memory cells with a suitable selection voltage. Moreover, row controller 1304 can facilitate program, erase or read operations by applying suitable voltages at selected wordlines.

A clock source(s) 1308 can provide respective clock pulses to facilitate timing for read, write, and program operations of row control 1304 and column control 1306. Clock source(s) 1308 can further facilitate selection of wordlines or bit lines in response to external or internal commands received by operating and control environment 1300. An input/output buffer 1312 can be connected to an external host apparatus, such as a computer or other processing device (not depicted) by way of an I/O buffer or other I/O communication interface. Input/output buffer 1312 can be configured to receive write data, receive an erase instruction, output readout data, and receive address data and command data, as well as address data for respective instructions. Address data can be transferred to row controller 1304 and column controller 1306 by an address register 1310. In addition, input data is transmitted to memory cell array 1302 via signal input lines, and output data is received from memory cell array 1302 via signal output lines. Input data can be received from the host apparatus, and output data can be delivered to the host apparatus via the I/O buffer.

Commands received from the host apparatus can be provided to a command interface 1314. Command interface 1314 can be configured to receive external control signals from the host apparatus, and determine whether data input to the input/output buffer 1312 is write data, a command, or an address. Input commands can be transferred to a state machine 1316.

State machine 1316 can be configured to manage programming and reprogramming of memory cell array 1302. State machine 1316 receives commands from the host apparatus via input/output interface 1312 and command interface 1314, and manages read, write, erase, data input, data output, and like functionality associated with memory cell array 1302. In some aspects, state machine 1316 can send and receive acknowledgments and negative acknowledgments regarding successful receipt or execution of various commands.

In an embodiment, state machine 1316 can control an analog voltage waveform generator 1318 that provides read/write and program/erase signals to row control 1304 and column control 1306.

To implement read, write, erase, input, output, etc., functionality, state machine 1316 can control clock source(s) 1308. Control of clock source(s) 1308 can cause output pulses configured to facilitate row controller 1304 and column controller 1306 implementing the particular functionality. Output pulses can be transferred to selected bit lines by column controller 1306, for instance, or wordlines by row controller 1304, for instance.

The illustrated aspects of the disclosure may also be practiced in distributed computing environments where certain tasks are performed by remote processing devices that are linked through a communications network. In a distributed computing environment, program modules or stored information, instructions, or the like can be located in local or remote memory storage devices.

Moreover, it is to be appreciated that various components described herein can include electrical circuit(s) that can include components and circuitry elements of suitable value in order to implement the embodiments of the subject innovation(s). Furthermore, it can be appreciated that many of the various components can be implemented on one or more IC chips. For example, in one embodiment, a set of components can be implemented in a single IC chip. In other embodiments, one or more respective components are fabricated or implemented on separate IC chips.

In connection with FIG. 14, the systems and processes described below can be embodied within hardware, such as a single integrated circuit (IC) chip, multiple ICs, an application specific integrated circuit (ASIC), or the like. Further, the order in which some or all of the process blocks appear in each process should not be deemed limiting. Rather, it should be understood that some of the process blocks can be executed in a variety of orders, not all of which may be explicitly illustrated herein.

Figure 14:
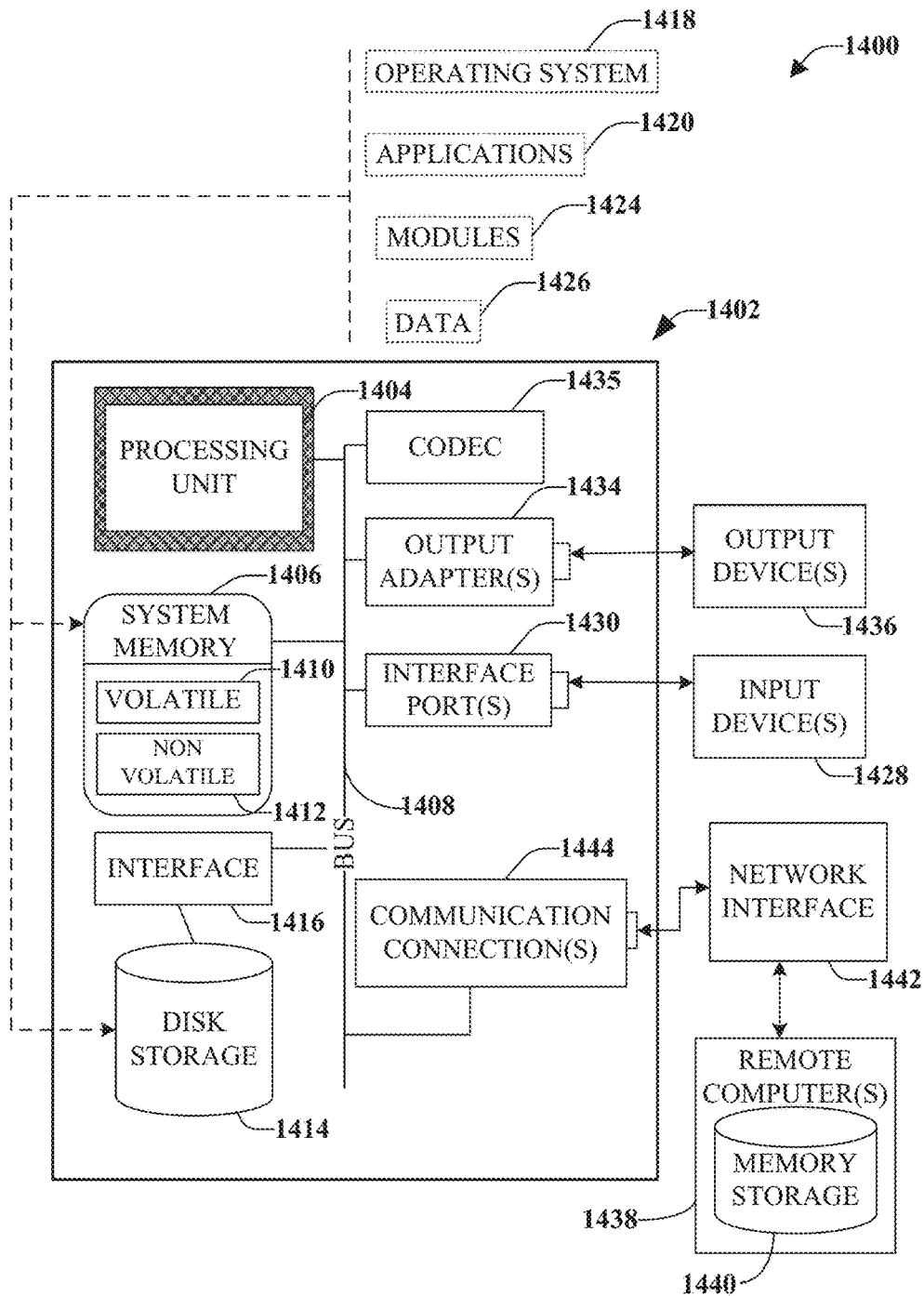
FIG. 14 illustrates a block diagram of an example computing environment that can be implemented in conjunction with various embodiments.

With reference to FIG. 14, a suitable environment 1400 for implementing various aspects of the claimed subject matter includes a computer 1402. The computer 1402 includes a processing unit 1404, a system memory 1406, a codec 1435, and a system bus 1408. The system bus 1408 couples system components including, but not limited to, the system memory 1406 to the processing unit 1404. The processing unit 1404 can be any of various available processors. Dual microprocessors and other multiprocessor architectures also can be employed as the processing unit 1404.

The system bus 1408 can be any of several types of bus structure(s) including the memory bus or memory controller, a peripheral bus or external bus, or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI).

The system memory 1406 includes volatile memory 1410 and non-volatile memory 1412, which can employ one or more of the disclosed memory architectures, in various embodiments. The basic input/output system (BIOS), containing the basic routines to transfer information between elements within the computer 1402, such as during start-up, is stored in non-volatile memory 1412. In addition, according to present innovations, codec 1435 may include at least one of an encoder or decoder, wherein the at least one of an encoder or decoder may consist of hardware, software, or a combination of hardware and software. Although, codec 1435 is depicted as a separate component, codec 1435 may be contained within non-volatile memory 1412. By way of illustration, and not limitation, non-volatile memory 1412 can include read only memory (ROM), programmable ROM (PROM), electrically programmable ROM (EPROM), electrically erasable programmable ROM (EEPROM), or Flash memory. Non-volatile memory 1412 can employ one or more of the disclosed memory devices, in at least some embodiments. Moreover, non-volatile memory 1412 can be computer memory (e.g., physically integrated with computer 1402 or a mainboard thereof), or removable memory. Examples of suitable removable memory with which disclosed embodiments can be implemented can include a secure digital (SD) card, a compact Flash (CF) card, a universal serial bus (USB) memory stick, or the like. Volatile memory 1410 includes random access memory (RAM), which acts as external cache memory, and can also employ one or more disclosed memory devices in various embodiments. By way of illustration and not limitation, RAM is available in many forms such as static RAM (SRAM), dynamic RAM (DRAM), synchronous DRAM (SDRAM), double data rate SDRAM (DDR SDRAM), and enhanced SDRAM (ESDRAM) and so forth.

Computer 1402 may also include removable/non-removable, volatile/non-volatile computer storage medium. FIG. 14 illustrates, for example, disk storage 1414. Disk storage 1414 includes, but is not limited to, devices like a magnetic disk drive, solid state disk (SSD) floppy disk drive, tape drive, Jaz drive, Zip drive, LS-100 drive, flash memory card, or memory stick. In addition, disk storage 1414 can include storage medium separately or in combination with other storage medium including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 1414 to the system bus 1408, a removable or non-removable interface is typically used, such as interface 1416. It is appreciated that storage devices 1414 can store information related to a user. Such information might be stored at or provided to a server or to an application running on a user device. In one embodiment, the user can be notified (e.g., by way of output device(s) 1436) of the types of information that are stored to disk storage 1414 or transmitted to the server or application. The user can be provided the opportunity to opt-in or opt-out of having such information collected or shared with the server or application (e.g., by way of input from input device(s) 1428).

It is to be appreciated that FIG. 14 describes software that acts as an intermediary between users and the basic computer resources described in the suitable operating environment 1400. Such software includes an operating system 1418. Operating system 1418, which can be stored on disk storage 1414, acts to control and allocate resources of the computer system 1402. Applications 1420 take advantage of the management of resources by operating system 1418 through program modules 1424, and program data 1426, such as the boot/shutdown transaction table and the like, stored either in system memory 1406 or on disk storage 1414. It is to be appreciated that the claimed subject matter can be implemented with various operating systems or combinations of operating systems.

A user enters commands or information into the computer 1402 through input device(s) 1428. Input devices 1428 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1404 through the system bus 1408 via interface port(s) 1430. Interface port(s) 1430 include, for example, a serial port, a parallel port, a game port, and a universal serial bus (USB). Output device(s) 1436 use some of the same type of ports as input device(s) 1428. Thus, for example, a USB port may be used to provide input to computer 1402 and to output information from computer 1402 to an output device 1436. Output adapter 1434 is provided to illustrate that there are some output devices 1436 like monitors, speakers, and printers, among other output devices 1436, which require special adapters. The output adapters 1434 include, by way of illustration and not limitation, video and sound cards that provide a means of connection between the output device 1436 and the system bus 1408. It should be noted that other devices or systems of devices provide both input and output capabilities such as remote computer(s) 1438.

Computer 1402 can operate in a networked environment using logical connections to one or more remote computers, such as remote computer(s) 1438. The remote computer(s) 1438 can be a personal computer, a server, a router, a network PC, a workstation, a microprocessor based appliance, a peer device, a smart phone, a tablet, or other network node, and typically includes many of the elements described relative to computer 1402. For purposes of brevity, only a memory storage device 1440 is illustrated with remote computer(s) 1438. Remote computer(s) 1438 is logically connected to computer 1402 through a network interface 1442 and then connected via communication connection(s) 1444. Network interface 1442 encompasses wire or wireless communication networks such as local-area networks (LAN) and wide-area networks (WAN) and cellular networks. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL).

Communication connection(s) 1444 refers to the hardware/software employed to connect the network interface 1442 to the bus 1408. While communication connection 1444 is shown for illustrative clarity inside computer 1402, it can also be external to computer 1402. The hardware/software necessary for connection to the network interface 1442 includes, for exemplary purposes only, internal and external technologies such as, modems including regular telephone grade modems, cable modems and DSL modems, ISDN adapters, and wired and wireless Ethernet cards, hubs, and routers.

As utilized herein, terms "component," "system," "architecture" and the like are intended to refer to a computer or electronic-related entity, either hardware, a combination of hardware and software, software (e.g., in execution), or firmware. For example, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, . . . ) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source(s), signal generator(s), communication bus(ses), controllers, I/O interface, address registers, and so on. It is to be appreciated that some overlap in definitions is anticipated, and an architecture or a system can be a stand-alone component, or a component of another architecture, system, etc.

In addition to the foregoing, the disclosed subject matter can be implemented as a method, apparatus, or article of manufacture using typical manufacturing, programming or engineering techniques to produce hardware, firmware, software, or any suitable combination thereof to control an electronic device to implement the disclosed subject matter. The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Computer-readable transport media can include carrier waves, or the like. Of course, those skilled in the art will recognize many modifications can be made to this configuration without departing from the scope or spirit of the disclosed subject matter.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the disclosure. Furthermore, to the extent that a term "includes", "including", "has" or "having" and variants thereof is used in either the detailed description or the claims, such term is intended to be inclusive in a manner similar to the term "comprising" as "comprising" is interpreted when employed as a transitional word in a claim.

In various embodiments, the voltages applied to the memory device were illustrated to be linear. In other embodiments, the voltages may be non-linear, step-type functions, or the like.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise or apparent from the foregoing discussion, it is appreciated that throughout the disclosed subject matter, discussions utilizing terms such as processing, computing, replicating, mimicking, determining, or transmitting, and the like, refer to the action and processes of processing systems, and/or similar consumer or industrial electronic devices or machines, that manipulate or transform data or signals represented as physical (electrical or electronic) quantities within the circuits, registers or memories of the electronic device(s), into other data or signals similarly represented as physical quantities within the machine or computer system memories or registers or other such information storage, transmission and/or display devices.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In addition, while a particular feature may have been disclosed with respect to only one of several implementations, such feature may be combined with one or more other features of the other implementations as may be desired and advantageous for any given or particular application. It will also be recognized that the embodiments include a system as well as a computer-readable medium having computer-executable instructions for performing the acts and/or events of the various processes.

What is claimed is:

1. A neuromorphic logic system, comprising:
   a bit line and a set of wordlines;
   a plurality of resistive switching memory cells, respectively comprising a two-terminal volatile bipolar switching device and a two-terminal non-volatile memory device, respective resistive switching memory cells of the plurality of resistive switching memory cells positioned at each intersection between the bit line and the set of wordlines, having first terminals connected to the bitline and second terminals connected to respective wordlines of the set of wordlines, wherein the plurality of resistive switching memory cells are programmed to a set of resistive states and receive a voltage on the bitline above an activation threshold corresponding to activation of the two-terminal volatile bipolar switching device, and wherein the magnitude of the voltage applied to the bitline corresponds to a magnitude of a sensory input, resulting in a first set of currents through the set of resistive switching memory cells and that sum to a current on the bitline, which current corresponds to a response of the neuromorphic logic system to the sensory input.

2. The neuromorphic logic system of claim 1, wherein bitline models a neuron, and the set of wordlines model a second neuron.

3. The neuromorphic logic system of claim 2, wherein the plurality of resistive switching memory cells models a synapse between the neuron and the second neuron.

4. The neuromorphic logic system of claim 1, wherein a voltage applied across the bitline during a programming phase is above 2.8V.

5. The neuromorphic logic system of claim 1, wherein a current between the bitline and the set of wordlines is based on a function of resistive states of the plurality of resistive switching memory cells.

6. The neuromorphic logic system of claim 1, wherein an accuracy of a relationship between the sensory input and the current is based on a number of resistive memory cells on the bitline.

7. The neuromorphic logic system of claim 1, further comprising a second bitline connected to a second set of wordlines via a second plurality of resistive switching memory cells programmed to a second set of resistive states, wherein the second bitline is connected to a second sensory input and models a neuron, the second set of wordlines model a second neuron and the second plurality of resistive switching memory cells model a synapse between the neuron and the second neuron.

8. The neuromorphic logic system of claim 1, wherein the two-terminal non-volatile memory device is a bipolar resistance switching device.

9. The neuromorphic logic system of claim 1, wherein the two-terminal non-volatile memory device has an activation/deactivation current ratio of 10E5 or greater.

10. The neuromorphic logic system of claim 7, further comprising a second voltage applied to the second bitline resulting in a second set of currents through the second plurality of resistive switching memory cells that sum to a second current on the second bitline, the second current representing a response of the synapse to the second sensory input.

11. The neuromorphic logic system of claim 7, wherein the voltage comprises a first magnitude sufficient to activate two-terminal volatile bipolar switching devices of the plurality of resistive switching memory cells, and further comprising a second voltage applied to the second bitline that comprises a second magnitude that does not activate two-terminal volatile bipolar switching devices of the second plurality of resistive switching memory cells.

12. The neuromorphic logic system of claim 1, wherein the set of resistive states represent a bit of a binary number entered as an input to the neuromorphic logic system, and wherein each resistive switching memory cell of the plurality of resistive switching memory cells is programmed to a common resistance value, wherein an order of the bit of the binary number is modeled by a number of the resistive switching memory cells in the plurality of the resistive switching memory cells, and wherein lower or higher order bits of the binary number are modeled by additional pluralities of resistive switching memory cells having fewer or larger numbers, respectively, of the resistive switching memory cells programmed to the common resistance value.

13. A neuromorphic logic system, comprising:
   a wordline;
   a sensory input circuit connected to the wordline and configured to supply a voltage to the wordline having a magnitude that corresponds to an input signal received at the sensory input circuit;
   a plurality of bitlines each intersecting the wordline and forming a plurality of intersections between the wordline and the plurality of bitlines; and
   a plurality of resistive switching memory cells, respectively comprising a two-terminal bipolar volatile switching device and a two-terminal non-volatile memory device, wherein:
      a resistive switching memory cell of the plurality of resistive switching memory cells is positioned at respective intersections of the plurality of intersections between the wordline and the plurality of bitlines and having first terminals connected to the wordline and second terminals connected to respective bitlines of the plurality of bitlines,
      the plurality of resistive switching memory cells are respectively programmed to a resistive state of at least two resistive states,
      the voltage supplied on the wordline is received at respective first terminals of the plurality of resistive switching memory cells and, in response to the voltage being above an activation threshold of the two-terminal volatile switching device, activates each of the plurality of resistive switching memory cells, and
      the voltage causes a plurality of currents at the plurality of bitlines having current magnitudes in proportion to programmed resistive states of respective resistive switching memory cells connected to each of the plurality of bitlines.

14. The neuromorphic logic system of claim 13, wherein a program voltage applied across the wordline during a programming phase of the neuromorphic logic system is above 2.8V.

15. The neuromorphic logic system of claim 13, wherein a read voltage applied across the wordline and a bitline of the plurality of bitlines is greater than or equal to 0.8 volts and less than or equal to 1.6 volts.

16. The neuromorphic logic system of claim 13, wherein an accuracy of a relationship between the input signal received at the sensory input circuit and an output of the set of bitlines is related to a number of the plurality of resistive switching memory cells connected to the wordline.

17. The neuromorphic logic system of claim 13, further comprising a second wordline connected to another plurality of bitlines via a second set of resistive switching memory cells, wherein the second wordline is connected to a second sensory input circuit.

18. The neuromorphic logic system of claim 13, wherein the sensory input circuit is a model of a temperature input circuit.

19. The neuromorphic logic system of claim 13, wherein the sensory input is a model of an audio input circuit.

20. The neuromorphic logic system of claim 13, further comprising: a second wordline connected to the sensory input circuit and to the plurality of bitlines via a second plurality of resistive switching memory cells, wherein the voltage supplied on the wordline represents a zeroth order binary value of the input signal received at the sensory input circuit, and a second voltage supplied on the second wordline represents a first order binary value of the input signal, and further wherein:
- the plurality of currents sum on the wordline to a zeroth order binary response of the neuromorphic logic system; and
- a second plurality of currents on the second plurality of bitlines sum on the second wordline to a first order binary response of the neuromorphic logic system.

* * * * *